(12) United States Patent
Yi et al.

(10) Patent No.: US 9,229,226 B2
(45) Date of Patent: Jan. 5, 2016

(54) HYBRID APPARATUS AND METHODS FOR ANALYZING ELECTROMAGNETIC WAVES

(75) Inventors: Shin-Wook Yi, Hwaseong-si (KR); Masatomo Nakazato, Yokohama (JP); Tetsunori Wada, Yokohama (JP); Hyun-joo Kim, Hwaseong-si (KR); Young-kwan Park, Suwon-si (KR); Jae-sung Shin, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 664 days.

(21) Appl. No.: 13/494,226

(22) Filed: Jun. 12, 2012

(65) Prior Publication Data

US 2012/0330630 A1 Dec. 27, 2012

(30) Foreign Application Priority Data

Jun. 24, 2011 (KR) .................. 10-2011-0061797

(51) Int. Cl.
*G06F 7/60* (2006.01)
*G06F 17/10* (2006.01)
*G02B 27/00* (2006.01)
*G06F 17/50* (2006.01)
*G02F 1/313* (2006.01)
*G02F 1/00* (2006.01)
*G02B 6/35* (2006.01)

(52) U.S. Cl.
CPC .......... *G02B 27/0012* (2013.01); *G02F 1/0081* (2013.01); *G02F 1/3134* (2013.01); *G06F 17/5018* (2013.01); *G02B 6/3588* (2013.01)

(58) Field of Classification Search
CPC ............ G06F 17/5018; G02B 27/0012; G02B 6/3588; G02F 1/3134; G02F 1/0081
USPC ........................................................ 703/2, 5
See application file for complete search history.

(56) References Cited

U.S. PATENT DOCUMENTS

2008/0077367 A1* 3/2008 Odajima .......................... 703/2

FOREIGN PATENT DOCUMENTS

| JP | 2005-141698 A | 6/2005 |
| JP | 2009-223669 A | 10/2009 |
| KR | 10-2009-0061777 A | 6/2009 |

OTHER PUBLICATIONS

Yoshimura, Tetsuzo et al., Three-Dimensional Micro-Optical Switching System Architecture Using Slab-Waveguide-Based Micro-Optical Switches, Feb. 2003, Opt. Eng. 42 (2), Society of Photo-Optical Instrumentation Engineers.*

(Continued)

*Primary Examiner* — Kamini S Shah
*Assistant Examiner* — Cedric D Johnson
(74) *Attorney, Agent, or Firm* — Myers Bigel Sibley & Sajovec, P.A.

(57) ABSTRACT

Analysis of an electromagnetic wave traveling in an optical device, can be performed quickly and correctly. A structure forming process simulator forms an analysis structure of a physical object to be analyzed. A hybrid optical simulator calculates time-independent data and time-dependent data of an electromagnetic field by dividing the analysis structure into parts, determining whether a metallic or magnetic material is included in each of the divided parts, and selectively applying a Beam Propagation Method (BPM) or a Finite Difference Time Domain (FDTD) method to the divided parts. A storage device stores the time-independent data and the time-dependent data output from the hybrid optical simulator as hybrid electric field data. Related methods are also described.

31 Claims, 23 Drawing Sheets

(56) References Cited

OTHER PUBLICATIONS

Masoudi, Husain M. et al., "Efficient Time-Domain Beam-Propagation Method for Modeling Integrated Optical Devices", May 2001, Journal of Lightwave Technology, vol. 19, No. 5, IEEE.*

Oskooi, Ardavan F. et al., "MEEP: A Flexible Free-Software Package for Electromagnetic Simulations by the FDTD Method", Mar. 2010, Computer Physics Communications 181, Elsevier B.V.*

Teixeira, Fernando L., "Time-Domain Finite-Difference and Finite-Element Methods for Maxwell Equations in Complex Media", Aug. 2008, IEEE Transactions on Antennas and Propagation, vol. 56, No. 8, IEEE.*

Yamauchi, Junji et al., "Implicit Yee-Mesh-Based Finite-Difference Full-Vectorial Beam-Propagation Method", May 2005, Journal of Lightwave Technology, vol. 23, No. 5, IEEE.*

Shibayama, Jun et al., "A Finite-Difference Time-Domain Beam-Propagation Method for TE- and TM-Wave Analyses", Jul. 2003, Journal of Lightwave Technology, vol. 21, No. 7, IEEE.*

Phoenix Software, "Finite Difference Time Domain and BPM: Flexible Algorithm Selection Technology", Oct. 20, 2008.*

* cited by examiner

HYBRID APPARATUS AND METHODS FOR ANALYZING ELECTROMAGNETIC WAVES

CROSS-REFERENCE TO RELATED APPLICATION

This application claims the benefit of Korean Patent Application No. 10-2011-0061797, filed on Jun. 24, 2011, in the Korean Intellectual Property Office, the disclosure of which is incorporated herein in its entirety by reference.

BACKGROUND

Various embodiments described herein relate to apparatus and methods for analyzing electromagnetic waves.

The development of computer technology has significantly changed methods of analyzing electromagnetic field problems. Engineers in the electromagnetic wave field can now depend on computer technology to analyze complicated electromagnetic field problems. Although the analysis of many electromagnetic field problems may be achieved by solving one or two partial differential equations, few problems can be substantially solved without the help of a computer. Many cases depend on a computer due to the necessity for complicated analysis, such as scattering at a complicated boundary, loss in a lossy material, or a phase retardation in an anisotropic material.

SUMMARY

Various embodiments described herein can provide apparatus and methods for analyzing electromagnetic waves, whereby an electromagnetic wave analysis, in particular, an analysis of an electromagnetic wave traveling in an optical device, can be performed quickly and correctly.

According to some embodiments described herein, there is provided an apparatus for analyzing an electromagnetic wave, the apparatus including: a structure forming process simulator configured to form an analysis structure of a physical object to be analyzed; a hybrid optical simulator configured to calculate time-independent data and time-dependent data of an electromagnetic field by receiving the analysis structure from the structure forming process simulator, dividing the analysis structure into parts, determining whether a metallic or magnetic material is included in each of the divided parts, and selectively applying a Beam Propagation Method (BPM) or a Finite Difference Time Domain (FDTD) method to the divided parts; and a storage device configured to store the time-independent data and the time-dependent data output from the hybrid optical simulator as hybrid electric field data.

The hybrid optical simulator may include: a receiving unit configured to receive the analysis structure; an optical source setting unit configured to set initial optical source generation, based on the analysis structure; a BPM simulation unit configured to calculate the time-independent data in the BPM; an FDTD simulation unit configured to calculate the time-dependent data in the FDTD method; and a material decision unit configured to determine whether a metallic or magnetic material is included in each of the divided parts. The BPM simulation unit may include: a BPM grid element configured to form a BPM grid corresponding to the division with respect to the analysis structure; and a BPM calculating element configured to calculate an electric field by the BPM with respect to each surface of the BPM grid that is perpendicular to a light-traveling direction, and the FDTD simulation unit may include: an FDTD grid element configured to form an FDTD grid for the FDTD method with respect to the analysis structure; and an FDTD calculating element configured to calculate an electric field and a magnetic field in the FDTD method with respect to each surface of the FDTD grid that is perpendicular to a light-traveling direction.

The FDTD grid element may form the FDTD grid for applying the FDTD method if the material decision unit determines that a metallic or magnetic material is included in a surface of the BPM grid, and the FDTD calculating element may transmit only the calculated electric field of the calculated electric field and magnetic field as the time-dependent data. The material decision unit may determine by calculating a refractive index whether a metallic or magnetic material is included in each surface of the BPM grid that corresponds to each of the divided parts.

The hybrid optical simulator may further include an FDTD use decision unit configured to decide the use of the FDTD method, wherein the hybrid optical simulator uses the BPM as a default mode but selectively uses the BPM or the FDTD method according to the decision of the FDTD use decision unit.

The hybrid optical simulator may sequentially calculate the time-independent data in the BPM for each surface of the BPM grid that corresponds to each of the divided parts in the light-traveling direction with respect to the analysis structure, but may calculate the time-dependent data for each surface of the FDTD grid by forming the FDTD grid for the FDTD method with respect to a surface of the BPM grid in which a metallic or magnetic material is included and calculate the time-independent data for a next surface of the BPM grid if the calculation for each surface of the FDTD grid is completed. The time-independent data calculated with respect to each surface of the BPM grid or the time-dependent data calculated with respect to each surface of the FDTD grid may be real-time and sequentially stored in the storage device as the hybrid electric field data, or may be real-time and sequentially stored in a temporary storage device as the hybrid electric field data, and if the entire analysis structure is completely analyzed, the hybrid electric field data may be transmitted from the temporary storage device to the storage device and stored in the storage device.

The structure forming process simulator may form the analysis structure of the entire or a portion of the physical object to be analyzed and modify the analysis structure based on the hybrid electric field data stored in the storage device.

Other embodiments described herein can provide an apparatus for analyzing an electromagnetic wave, the apparatus including: a structure forming process simulator configured to form an analysis structure of a physical object to be analyzed; a hybrid optical simulator configured to calculate data of an electric field by receiving the analysis structure from the structure forming process simulator and using any one of a Beam Propagation Method (BPM) mode in which the BPM is exclusively used, a Finite Difference Time Domain (FDTD) mode in which an FDTD method is exclusively used, and a hybrid mode in which the BPM and the FDTD methods are both used; and a storage device configured to store the data of an electric field output from the hybrid optical simulator.

The hybrid optical simulator may include: a receiving unit configured to receive the analysis structure; an optical source setting unit configured to set initial optical source generation, based on the analysis structure; a mode selecting unit configured to select any one of the BPM mode, the FDTD mode, and the hybrid mode; a BPM simulation unit configured to calculate time-independent data in the BPM; an FDTD simulation unit configured to calculate time-dependent data in the FDTD method; and a material decision unit configured to determine whether a metallic or magnetic material is included in each of divided parts of the analysis structure.

If the BPM mode is selected by the mode selecting unit, only the BPM simulation unit may operate, if the FDTD mode is selected by the mode selecting unit, only the FDTD simulation unit may operate, if the hybrid mode is selected by the mode selecting unit, both the BPM simulation unit and the FDTD simulation unit may operate, and if the BPM mode or the FDTD mode is selected by the mode selecting unit, the material decision unit may not operate.

The hybrid optical simulator may further include a structure complexity decision unit configured to determine a complexity of the analysis structure, wherein the mode selecting unit selects any one of the BPM mode, the FDTD mode, and the hybrid mode according to the complexity output from the structure complexity decision unit.

Other embodiments described herein can provide an apparatus for analyzing an electromagnetic wave, the apparatus including: a structure forming process simulator configured to form an analysis structure of a physical object to be analyzed; a hybrid optical simulator configured to calculate time-independent data and time-dependent data of an electric field by receiving the analysis structure from the structure forming process simulator and selectively applying a Beam Propagation Method (BPM) or a Finite Difference Time Domain (FDTD) method to a dielectric material part and a part including a metallic or magnetic material of the analysis structure based on information regarding the dielectric material part and the part including a metallic or magnetic material; and a storage device configured to store the time-independent data and the time-dependent data output from the hybrid optical simulator as hybrid electric field data.

The hybrid optical simulator may include: a receiving unit configured to receive the analysis structure; an optical source setting unit configured to set initial optical source generation, based on the analysis structure; a sector information unit having the information regarding the dielectric material part and the part including a metallic or magnetic material of the analysis structure; a BPM simulation unit configured to calculate the time-independent data in the BPM; and an FDTD simulation unit configured to calculate the time-dependent data in the FDTD method. Based on the information regarding the sector information unit, the BPM simulation unit may calculate the time-independent data in the BPM with respect to the dielectric material part, and the FDTD simulation unit may calculate the time-dependent data in the FDTD method with respect to the part including a metallic or magnetic material.

Other embodiments described herein can provide other apparatus for analyzing electromagnetic waves. These apparatus may comprise a hybrid optical simulator that is configured to perform a first electromagnetic wave analysis technique for metallic and magnetic materials in a physical object to be analyzed and to perform a second electromagnetic wave analysis technique, that is different from the first electromagnetic wave analysis technique, for non-metallic and non-magnetic materials in the physical object to be analyzed. A combiner may also be provided that is configured to combine results of the first electromagnetic wave analysis technique that was performed for the metallic and magnetic materials in the physical object to be analyzed and the second electromagnetic wave analysis technique that was performed for the non-metallic and non-magnetic materials in the physical object to be analyzed, to thereby analyze the electromagnetic wave that is produced by the physical object.

In some embodiments, the first electromagnetic wave analysis technique comprises a time-dependent electromagnetic wave analysis technique and the second electromagnetic wave analysis technique comprises a time-independent electromagnetic wave analysis technique. In other embodiments, the first electromagnetic wave analysis technique comprises a Finite difference Time domain (FDTD) electromagnetic wave analysis technique and the second electromagnetic wave analysis technique comprises a Beam Propagation Method (BPM) electromagnetic wave analysis technique. Moreover, in still other embodiments, the hybrid optical simulator is further configured to receive an analysis structure of the object to be analyzed, and is configured to perform the first electromagnetic wave analysis technique for metallic and magnetic materials in the analysis structure and to perform the second electromagnetic wave analysis technique for non-metallic and non-magnetic materials in the analysis structure.

Other embodiments described herein provide methods of analyzing an electromagnetic wave, the methods including: providing an analysis structure of a physical object to be analyzed in a structure forming process simulator; calculating at least one of time-independent data and time-dependent data of an electric field in a hybrid optical simulator by applying a Beam Propagation Method (BPM) or a Finite Difference Time Domain (FDTD) method to the analysis structure; and storing the at least one of the time-independent data and the time-dependent data output from the hybrid optical simulator in a storage device as hybrid electric field data.

The calculating of the at least one of the time-independent data and the time-dependent data may include: receiving the analysis structure; setting initial optical source generation, based on the analysis structure; determining whether a metallic or magnetic material is included in each of parts divided from the analysis structure, in a traveling direction of light generated by the optical source; and selectively calculating the time-independent data or the time-dependent data of each of the divided parts in the BPM or the FDTD method based on the determination result.

The determining and the selectively calculating may include: forming a BPM grid for the BPM in a BPM simulation unit; generating light on an initial surface $Z_0$ that is perpendicular to a light-traveling direction; substituting 1 into a variable k (k is an integer) of each surface of the BPM grid; first determining operation of determining whether a metallic or magnetic material is included in a kth surface $Z_k$ of the BPM grid; if a metallic or magnetic material is not included in the kth surface $Z_k$ of the BPM grid, calculating the time-independent data in the BPM with respect to the kth surface $Z_k$ of the BPM grid; second determining operation of determining whether the kth surface $Z_k$ is the end of the BPM grid; and if the kth surface $Z_k$ is not the end of the BPM grid, increasing k by 1, wherein the first determining operation is performed after increasing k by 1.

The method may further include: if a metallic or magnetic material is included in the kth surface $Z_k$ of the BPM grid, forming an FDTD grid for the FDTD method in an FDTD simulation unit; and calculating the time-dependent data in the FDTD method with respect to the FDTD grid, wherein the second determining operation is performed after calculating the time-dependent data. The FDTD grid may be formed with a narrower interval than that of the BPM grid, and the calculating of the time-dependent data may include calculating an electronic field and a magnetic field in the FDTD method but storing only the electronic field of the electronic field and the magnetic field as the time-dependent data. The determining may include determining by calculating a refractive index whether a metallic or magnetic material is included.

The calculating of the at least one of the time-independent data and the time-dependent data may include: receiving the analysis structure; setting initial optical source generation, based on the analysis structure; selecting any one of a BPM mode in which the BPM is exclusively used, an FDTD mode in which the FDTD method is exclusively used, and a hybrid mode in which the BPM and the FDTD methods are both used; and calculating hybrid electric field data in at least one of the BPM and the FDTD method according to the selecting result.

The method may further include, before the selecting, determining a complexity of the analysis structure, wherein the selecting includes selecting any one of the BPM mode, the FDTD mode, and the hybrid mode according to the complexity.

The calculating of the at least one of the time-independent data and the time-dependent data may include: receiving the analysis structure; setting optical source generation, based on the analysis structure; forming a BPM grid for the BPM in a BPM simulation unit; determining whether the FDTD method is used; and calculating the hybrid electric field data by using the BPM exclusively or using the BPM and the FDTD method together.

The calculating of the at least one of the time-independent data and the time-dependent data may include: receiving the analysis structure; setting optical source generation, based on the analysis structure; receiving information regarding a dielectric material part and a part including a metallic or magnetic material of the analysis structure; and calculating the hybrid electric field data in the BPM for the dielectric material part and in the FDTD method for the part including a metallic or magnetic material based on the information.

Still other embodiments described herein can provide other methods of analyzing electromagnetic waves. A first electromagnetic wave analysis technique is performed for metallic and magnetic materials in a physical object to be analyzed. A second electromagnetic wave analysis technique, that is different from the first electromagnetic wave analysis technique, is performed for non-metallic and non-magnetic materials in the physical object to be analyzed. Results of the first electromagnetic wave analysis technique and the second electromagnetic wave analysis technique are combined, to thereby analyze the electromagnetic wave that is produced by the physical object. The performing a first electromagnetic wave analysis technique, the performing a second electromagnetic wave analysis technique and/or the combining are performed in a data processor.

BRIEF DESCRIPTION OF THE DRAWINGS

Various embodiments will be more clearly understood from the following detailed description taken in conjunction with the accompanying drawings in which.

DETAILED DESCRIPTION OF THE EMBODIMENTS

Figure 1:
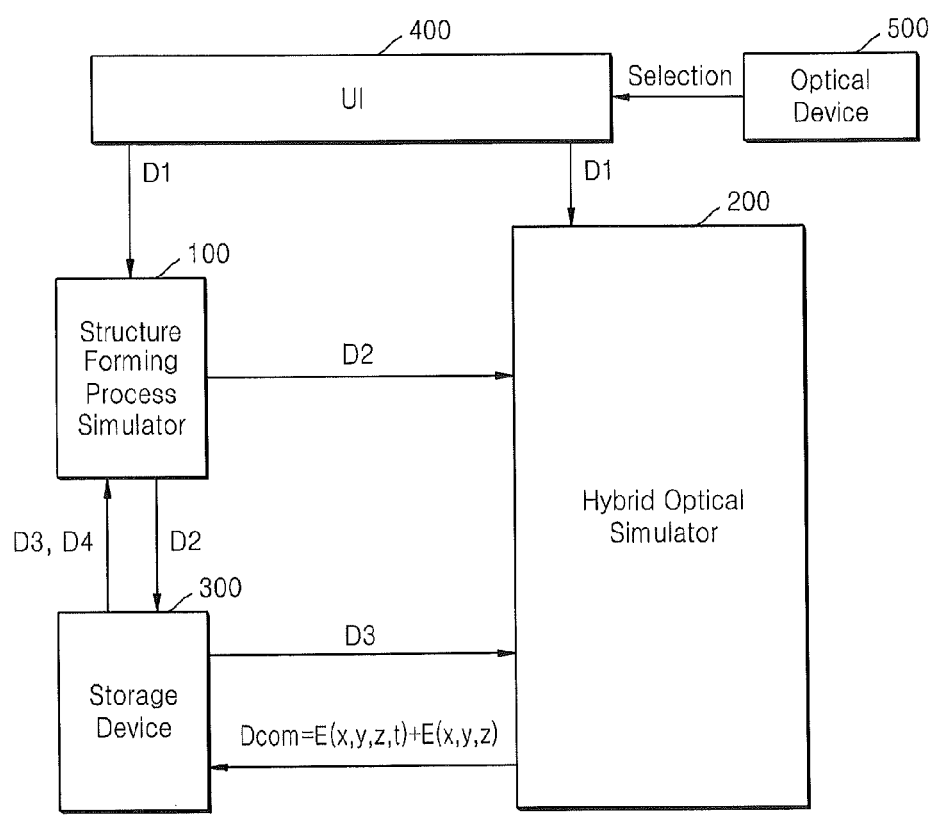
FIG. 1 is a block diagram of an apparatus for analyzing an electromagnetic wave, according to various embodiments described herein.

Various embodiments will now be described more fully with reference to the accompanying drawings. The inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art.

It will be understood that when an element is referred to as being "on," "connected to", "coupled to" or "responsive to" another element, it may be directly on, connected, coupled or responsive to the other element or intervening elements may be present. In contrast, when an element is referred to as being "directly on", "directly connected to", "directly coupled to" or "directly responsive to" another element, there are no intervening elements present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Various embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described below with reference to block diagrams and/or flowchart illustrations of methods, apparatus (systems) and/or computer program products according to embodiments of the invention. It is understood that each block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

It should also be noted that in some alternate implementations, the functions/acts noted in the flowchart blocks may occur out of the order noted in the flowchart blocks. For example, two blocks shown in succession may in fact be executed substantially concurrently or the blocks may sometimes be executed in the reverse order, depending upon the functionality/acts involved. Moreover, the functionality of a given block of the block diagrams or flowcharts may be separated into multiple blocks and/or the functionality of two or more blocks of the block diagrams or flowcharts may be at least partially integrated. Finally, other blocks may be added/inserted between the blocks that are illustrated.

FIG. 1 is a block diagram of an apparatus for analyzing an electromagnetic wave, according to various embodiments described herein.

Referring to FIG. 1, the electromagnetic wave analyzing apparatus may include a structure forming process simulator 100, a hybrid optical simulator 200, a storage device 300, and a User Interface (UI) 400. Reference numeral 500 denotes an optical device to be analyzed.

The structure forming process simulator 100 may form a three-dimensional (3D) analysis structure for optical devices to be analyzed and transmit information D2 regarding the analysis structure to the hybrid optical simulator 200. Occasionally, the information D2 regarding the analysis structure may be stored in the storage device 300. The analysis structure may be a 3D simulation structure formed by reflecting characteristics of a corresponding optical device in a 3D virtual space instead of an actual physical structure. That is, the structure forming process simulator 100 may form an analysis structure based on information regarding the optical device 500 to be analyzed which is input through the UI 400. The information regarding the optical device 500 may be regarding internal and external structures of the optical device 500 and a material component or a refractive index of each part of the internal structure and may act as parameters to form the analysis structure. Accordingly, the analysis structure may include not only information regarding a shape of the optical device 500 but also information regarding an analysis region and information regarding refractive indexes of materials of each part. Optical devices 500 to be analyzed are optical devices to be examined about how an electromagnetic field is formed and distributed according to an internal structure and materials by light traveling in the inside thereof. Required optical characteristics of the optical devices 500 may be determined by an electromagnetic field analysis in the inside thereof.

For example, the optical devices 500 may be a CMOS Image Sensor (CIS), an Optical Interconnect (OI) device, a solar cell, etc., and an electric field, hole-electron pair generation (or optical generation), and average optical power density of the optical devices 500 may be determined by an electromagnetic wave analysis. The above-described optical devices and optical characteristics are only illustrations, and optical devices to be analyzed in the current embodiment may be all optical devices in which an electromagnetic wave travels in the inside thereof. In addition, optical characteristics to be analyzed may also be others.

The structure forming process simulator 100 may change the analysis structure by changing parameters of the analysis structure based on electromagnetic field data calculated with respect to the formed analysis structure. That is, the structure forming process simulator 100 may extract required electric field data while changing the analysis structure based on result data with respect to an electric field of a current analysis structure. When the required electric field data is extracted, the performance of the optical device 500 may be increased by inversely changing a structure or materials of the optical device 500 to be analyzed based on the information D2 regarding the analysis structure.

The hybrid optical simulator 200 may calculate electric field data by receiving the information D2 regarding the analysis structure from the structure forming process simulator 100, dividing the analysis structure into parts, and selectively applying a Beam Propagation Method (BPM) or a Finite Difference Time Domain (FDTD) method to the divided parts according to whether a metallic or magnetic material is included in each of the divided parts. The electric field data may include time-dependent data relying on time and time-independent data not relying on time. For example, the electric field data calculated in the BPM may be the time-independent data, and the electric field data calculated in the FDTD method may be the time-dependent data.

The FDTD method and the BPM have been used as electromagnetic wave analyzing methods. The FDTD method is a non-approximate numerical analysis method that uses Maxwell's equations, While the FDTD method can correctly perform an electromagnetic wave analysis with respect to optical devices to be analyzed, the FDTD method generally requires very large computing resources and a long analysis time for convergence due to complex calculations. The BPM is a method of performing the analysis under the assumption that an electric field is not changed according to time. While the BPM can perform a quick operation with respect to an electric field by removing a time component, the BPM does not analyze an induced current generated on a surface of a metallic or magnetic material, so the BPM method may incorrectly perform or cannot perform the analysis with respect to optical devices including a metallic or magnetic material.

Hybrid techniques described herein can use the best aspects of FDTD and BPM while reducing the potential disadvantages. An optical device is divided into a non-metallic part and a metallic part, and an electromagnetic wave of a corresponding part is analyzed by selectively applying the BPM and the FDTD method to the corresponding part, which can significantly increase an electromagnetic wave analysis speed and correctly perform the electromagnetic wave analysis. In some embodiments, a hybrid electromagnetic wave analysis with respect to optical devices including a metallic or magnetic material can be quickly and correctly performed without a separate operation by analyzing an electromagnetic wave by using the BPM as a default but by analyzing an electric field additionally generated due to an induced current on a surface of the metallic or magnetic material by using the FDTD method automatically changed from the BPM.

The BPM is an analysis method under an assumption of no change of an electric field according to time by removing a time component from Maxwell's equations, and the FDTD method is a non-approximate numerical analysis method that uses Maxwell's equations, which includes a time component unlike the BPM. The BPM and the FDTD method will be described in more detail with reference to FIG. 2 or 10.

As described above, the hybrid optical simulator 200 calculates the time-independent data and the time-dependent data of the electric field with respect to the analysis structure by selectively applying the BPM or the FDTD method to the analysis structure and transmits the calculated time-independent data (E(x, y, z)) and the calculated time-dependent data (E(x, y, z, t)) of the electric field to the storage device 300 as hybrid electric field data Dcom.

Although the hybrid electric field data Dcom includes both the time-independent data and the time-dependent data as described above, the hybrid electric field data Dcom may include any one of them in any case. For example, the hybrid optical simulator 200 may exclusively apply any one of the BPM and the FDTD method based on a material distribution and a structure complexity of the analysis structure and accordingly calculate only any one of the time-independent data and the time-dependent data of the electric field as the hybrid electric field data.

The hybrid optical simulator 200 will be described in more detail with reference to FIGS. 2 to 7.

The storage device 300 may store the electric field data calculated by the hybrid optical simulator 200 as the hybrid electric field data Dcom, as described above. The hybrid electric field data Dcom may include the time-independent data of the electric field, which is calculated in the BPM, and the time-dependent data of the electric field, which is calculated in the FDTD method. That is, the hybrid electric field data Dcom including any one of the time-independent data and the time-dependent data of each corresponding divided part may be stored in the storage device 300 according to whether a metallic or magnetic material is included in each of the divided parts of the analysis structure.

The electric field data of each part of the analysis structure may be real-time and sequentially stored in the storage device 300 to form the hybrid electric field data Dcom, or may be real-time and sequentially stored in a temporary storage device (not shown) and stored in the storage device 300 as the hybrid electric field data Dcom of the entire analysis structure after the entire analysis structure is completely analyzed. The storage device 300 may store data D3 required by the structure forming process simulator 100 or the hybrid optical simulator 200 and supply the data D3 to the structure forming process simulator 100 or the hybrid optical simulator 200. In particular, hybrid electric field data D4 stored in the storage device 300 may be provided to the structure forming process simulator 100 and used by the structure forming process simulator 100 to modify the formed analysis structure.

A user may provide information D1 regarding the optical device 500 to be analyzed to the structure forming process simulator 100 or the hybrid optical simulator 200 via the UI 400.

FIGS. 2 to 7 are detailed block diagrams of the hybrid optical simulator 200 in the electromagnetic wave analyzing apparatus of FIG. 1, according to various embodiments described herein.

As described above, the hybrid optical simulator 200 receives the analysis structure from the structure forming process simulator 100 and performs a detailed electromagnetic wave analysis of the analysis structure. As a reference, an electromagnetic wave indicates a phenomenon that an electromagnetic field that has an intensity that is periodically changed is propagated into a space and is called an electron wave, and light, i.e., an optical beam, also belongs to the electromagnetic wave. The electromagnetic wave is a transverse wave that consists of an electric field and a magnetic field that are perpendicular to each other and may be correctly described with Maxwell's equations. Maxwell's equations will be described in more detail while describing the FDTD method with reference to FIG. 10 and below. Analyzing an electromagnetic wave indicates solving Maxwell's equations, thereby obtaining the intensity of an electric field and the intensity of a magnetic field at each position (x, y, z) and each time t. Thus, hereinafter, analyzing an electromagnetic wave may be used the same as calculating an electric field or the intensity of the electric field. In addition, an optical beam is generated and used to analyze an electromagnetic wave, wherein the optical beam may be named as light outside the analysis structure and named as an electromagnetic wave or an electric field inside the analysis structure. This is because while the concept of an electromagnetic wave is unnecessary when there is no electromagnetic interaction with other materials outside the analysis structure, the concept of an electromagnetic wave, i.e., the concept of an electric field, is required inside the analysis structure because an electromagnetic interaction with an internal material occurs inside the analysis structure.

Figure 2:
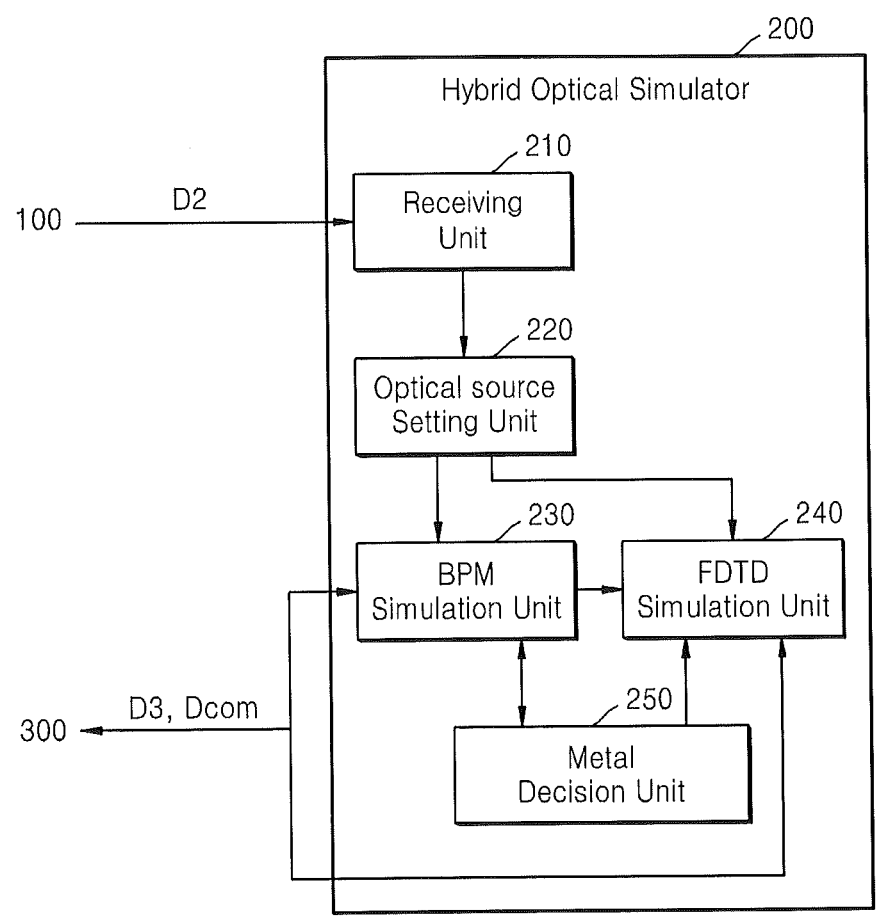
FIGS. 2 to 7 are block diagrams of a hybrid optical simulator in the apparatus for analyzing an electromagnetic wave of FIG. 1, according to various embodiments described herein.

Referring to FIG. 2, the hybrid optical simulator 200 may include a receiving unit 210, an optical source setting unit 220, a BPM simulation unit 230, an FDTD simulation unit 240, and a metal decision unit 250.

The receiving unit 210 receives the information D2 regarding the analysis structure from the structure forming process simulator 100 and transmits the information D2 regarding the analysis structure to the optical source setting unit 220 and may also transmit the information D2 regarding the analysis structure to the BPM simulation unit 230, the FDTD simulation unit 240, and the metal decision unit 250.

The optical source setting unit 220 sets an optical source incident on the analysis structure. That is, the optical source setting unit 220 sets values of an incident angle, a polarization, a wavelength, and an intensity of light incident on the analysis structure.

The BPM simulation unit 230 forms a BPM grid for the BPM, based on the light set with respect to the analysis structure and analyzes an electric field by the BPM on each grid surface. The BPM grid is formed in a form of a 3D lattice, and the grid surface may be a surface perpendicular to a light-traveling direction.

As described above, the BPM is an analysis method under an assumption of no change of an electric field according to time by removing a time component from Maxwell's equations. That is, the BPM is a method of calculating a distribution of light, i.e., a distribution of an electric field, on each grid surface by dividing an electric field calculation region into grids having small intervals and obtaining a relationship between values of electric field on each grid surface in the light-traveling direction from Maxwell's equations. Because the electric field data obtained in the BPM has no time component, the electric field data may be calculated as time-independent data.

The electric field analysis in the BPM may be able to perform a quick computation of an electric field because of no time component. The BPM may analyze an electric field from a size of the wavelength of light to a size of up to thousands times the wavelength of light. However, because the BPM cannot analyze an induced current generated on the surface of a metallic or magnetic material, the BPM incorrectly analyzes or cannot analyze an optical device including a metallic or magnetic material.

The BPM includes a Scalar BPM (SBPM) or a Vectorial BPM (VBPM) that are analysis methods of cases where a light-traveling direction is parallel to a z-axis by using a z-invariant approximation or a paraxial approximation. The SBPM uses a scalar wave equation and excludes a polarization characteristic, and the VBPM considers a Transverse Electric (TE) mode, a Transverse Magnetic (TM) mode, or a combination of the TE mode and the TM mode. To solve cases where a light-traveling direction is not parallel to the z-axis, a wide-angle BPM using a Pade approximation is used. According to calculation methods, the BPM is classified into a Finite Element Method (FEM) BPM, a Finite Difference Method (FDM) BPM, and a Fast Fourier Transform (FFT) BPM.

In the current embodiment, at least one of the various stated methods may be used as the BPM according to a structure to be analyzed. In addition, although not illustrated, another kind of BPM for calculating time-independent data of an electric field by employing the principle of the BPM may be of course used as the BPM of the current embodiment.

The FDTD simulation unit 240 forms an FDTD grid for the FDTD method and analyzes an electric field by the FDTD method on each grid surface. As described above, the FDTD method is a non-approximate numerical analysis method that uses Maxwell's equations, which includes a time component unlike the BPM. That is, the FDTD method may calculate a change of the electric field according to time. For example, because incident light is reflected from a metallic and/or magnetic material and an induced current is generated on a surface of the metallic and/or magnetic material, an electric field varies according to time even at the same position. As described above, because the BPM is a calculation method under an assumption that an electric field is not changed according to time, the BPM cannot correctly calculate an electric field for a part including a metallic and/or magnetic material. However, because the FDTD method calculates an electric field by using the Maxwell' equations dependent on both time and space as they are, the FDTD method may be able to calculate an electric field even if the electric field varies according to time. Eventually, the FDTD method may be able to correctly perform an electromagnetic wave analysis for structures of all materials including a metallic or magnetic material.

The FDTD method may analyze an electric field from a size of several times the wavelength of light to a size of one over several hundreds of the wavelength of light. Because electric field data obtained in the FDTD method includes a time component, the electric field data obtained in the FDTD method is definitely calculated as time-dependent data. However, because computation of the FDTD method is complicated, very large computing resources may be required and a long analysis time may be taken to convergence. The FDTD method will be described in more detail with reference to FIG. 10.

The metal decision unit 250 determines whether a metallic and/or magnetic material is included in each of the divided parts of the analysis structure, i.e., each surface of the BPM grid. In general, because most metallic materials have a magnetic nature, most metallic materials are magnetic materials. However, occasionally, metallic materials having a non-magnetic nature may exist. Accordingly, the metal decision unit 250 determines a material largely affecting an electromagnetic wave as a metallic and/or magnetic material. Such a metallic and/or magnetic material may be determined by a refractive index. That is, metallic materials generally have a high refractive index and have a characteristic having a reflectivity approximate to 1 because an imaginary number component is large in the definition of a complex refractive index.

Although the metal decision unit 250 determines a metallic and/or magnetic material based on the above-described refractive index, the metal decision unit 250 is not limited thereto, and of course, the metal decision unit 250 may determine a metallic and/or magnetic material based on another characteristic. For example, a metal or a non-metal may be determined based on an atomic weight of elements existing in a corresponding part or based on a resistance value. However, because the analysis of an electric field is a main target in the current embodiment, a metallic or magnetic material may be determined based on a refractive index associated with an electromagnetic wave.

The hybrid optical simulator 200 according to the current embodiment may calculate an electric field by determining whether a metallic and/or magnetic material is included in each of the divided parts of the analysis structure, e.g., each surface of the BPM grid, and selectively applying the BPM or the FDTD method to each of the divided parts of the analysis structure in the BPM simulation unit 230 or the FDTD simulation unit 240. Accordingly, the hybrid optical simulator 200 may quickly and correctly calculate an electric field of the entire analysis structure.

Figure 3:
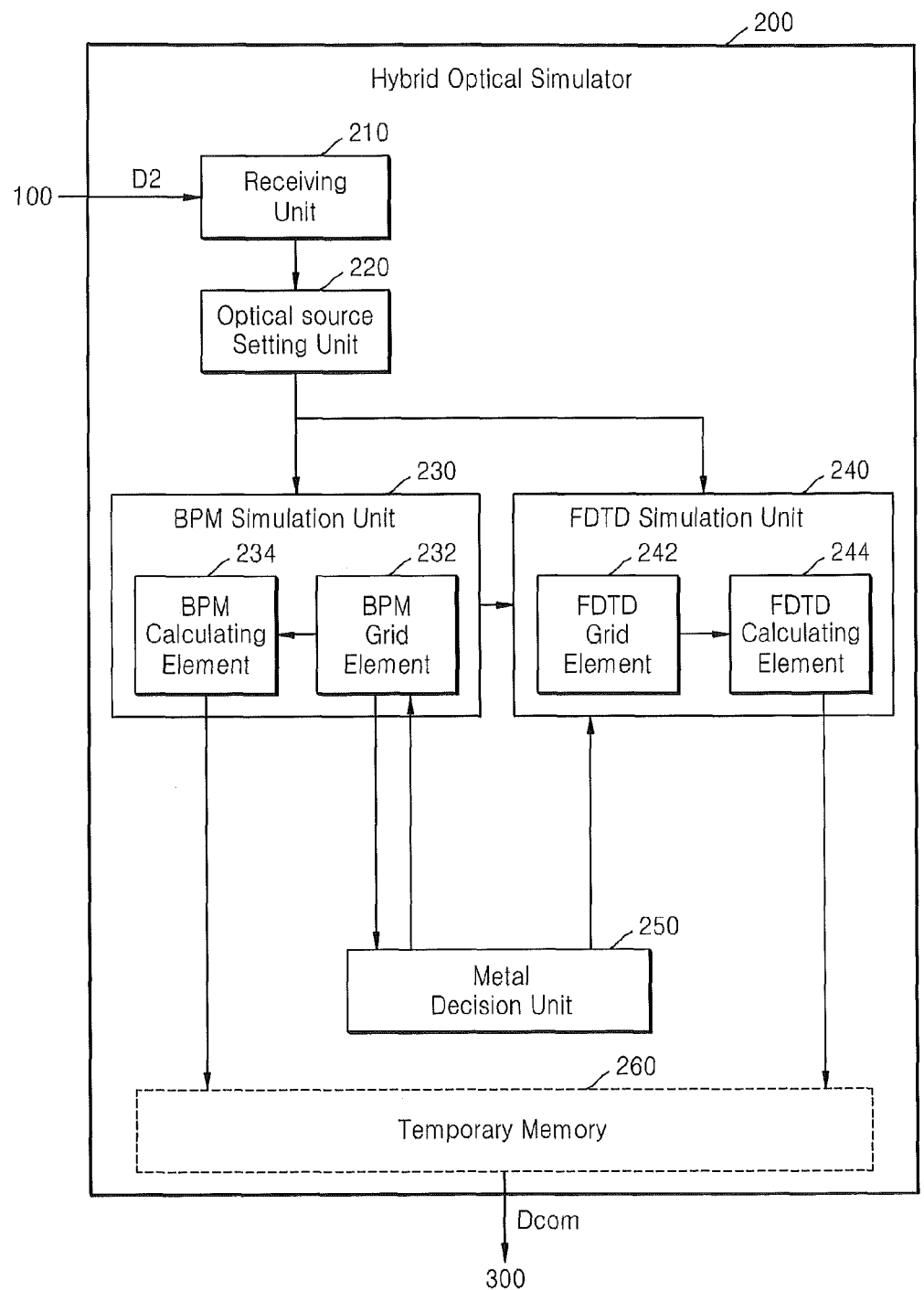

FIG. 3 is a detailed block diagram of the hybrid optical simulator 200 of FIG. 2, according to various embodiments described herein. For convenience of description, the description made with reference to FIG. 2 will be described in brief or omitted.

Referring to FIG. 3, the hybrid optical simulator 200 may include the receiving unit 210, the optical source setting unit 220, the BPM simulation unit 230, the FDTD simulation unit 240, and the metal decision unit 250, as described above.

The BPM simulation unit 230 may include a BPM grid element 232 and a BPM calculating element 234. The BPM grid element 232 may form a BPM grid for the BPM with respect to the analysis structure. The BPM grid element 232 may form a 3D BPM grid with an interval of around 20 nm in x-, y-, and z-axes directions. However, the BPM grid interval is not limited to 20 nm. That is, the BPM grid interval is changeable according to user settings, and accordingly, a BPM grid in various sizes may be formed according to an analysis structure of an optical device to be analyzed. Hereinafter, for convenience of description, the z-axis direction is defined as a light-traveling direction.

The BPM calculating element 234 calculates an electric field by the BPM on each BPM grid surface, e.g., each BPM grid surface perpendicular to the z-axis. In the current embodiment, the electric field may be calculated in each BPM grid surface by using the FFT-BPM. The electric field data, i.e., time-independent data, regarding each BPM grid surface, which is calculated by the BPM calculating element 234, may be stored in a temporary memory 260 or the storage device 300.

The FDTD simulation unit 240 may include an FDTD grid element 242 and an FDTD calculating element 244. The FDTD grid element 242 may form a 3D FDTD grid for the FDTD method with respect to a BPM grid surface determined to include a metallic or magnetic material by the metal decision unit 250. Information regarding the BPM grid surface may be received from the BPM simulation unit 230. The FDTD grid element 242 may also form an FDTD grid with an interval of around several nanometers less than the interval of the BPM grid in the x-, y-, and z-axes directions. The FDTD grid interval is also changeable according to user settings, and accordingly, an FDTD grid in various sizes may be formed according to a structure of a metallic or magnetic material included in a corresponding BPM grid surface.

The FDTD calculating element 244 calculates an electric field by the FDTD method on each FDTD grid surface, e.g., each FDTD grid surface perpendicular to the z-axis. The FDTD calculating element 244 may calculate electric fields of all FDTD grid surfaces formed with respect to a corresponding BPM grid surface. In general, the FDTD calculating element 244 calculates not only electric field data but also magnetic field data with respect to each FDTD grid surface according to the characteristics of Maxwell's equations. However, unless magnetic field data is particularly required in an optical device analysis, the magnetic field data is deleted from the electric field data and the magnetic field data and only the electric field data is stored as time-dependent data in the temporary memory 260 or the storage device 300.

The hybrid optical simulator 200 according to the current embodiment may quickly and correctly perform a hybrid electromagnetic wave analysis of the entire optical device including a metallic or magnetic material without a separate operation by analyzing an electromagnetic wave by the BPM as a default but analyzing an electric field additionally generated due to an induced current on a metallic or magnetic material surface by the FDTD method automatically changed from the BPM.

Figure 4:
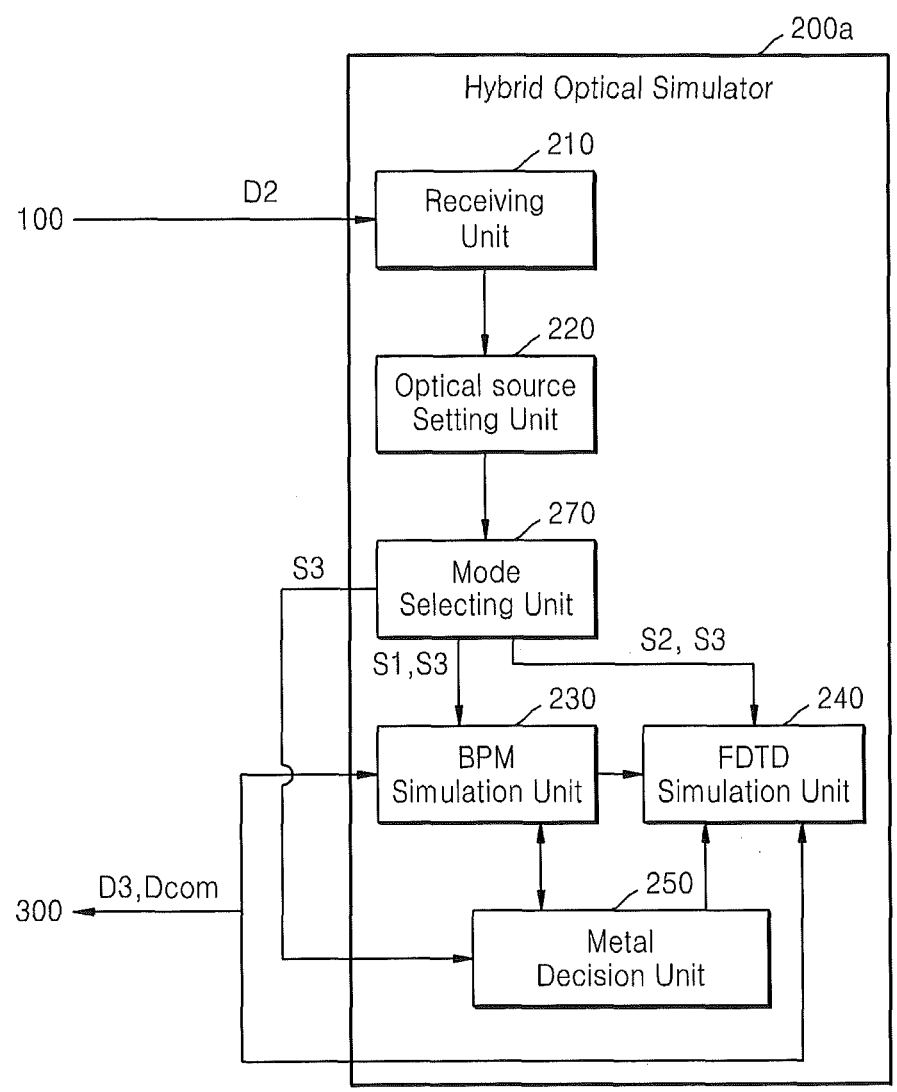

FIG. 4 is a block diagram of a modified example of the hybrid optical simulator 200 of FIG. 2, according to other embodiments described herein. For convenience of description, the description made with reference to FIG. 2 will be described in brief or omitted.

Referring to FIG. 4, a hybrid optical simulator 200a according to the current embodiment may further include a mode selecting unit 270. The mode selecting unit 270 may select any one of a BPM mode in which the BPM is exclusively used, an FDTD mode in which the FDTD method is exclusively used, and a hybrid mode in which the BPM and the FDTD methods are both used.

For example, when the mode selecting unit 270 selects the BPM mode, information S1 regarding the BPM mode selection may be transmitted to the BPM simulation unit 230, and when the mode selecting unit 270 selects the FDTD mode, information S2 regarding the FDTD mode selection may be transmitted to the FDTD simulation unit 240. When the mode selecting unit 270 selects the hybrid mode, information S3 regarding the hybrid mode selection may be transmitted to the BPM simulation unit 230, the FDTD simulation unit 240, and the metal decision unit 250. At least one of the BPM simulation unit 230, the FDTD simulation unit 240, and the metal decision unit 250 may operate according to mode selection information, thereby performing an electromagnetic wave analysis of an analysis structure by using at least one of the BPM and the FDTD method.

The hybrid optical simulator 200a may more quickly perform an electromagnetic wave analysis of an optical device by further including the mode selecting unit 270. For example, the FDTD method does not have to be applied to optical devices, such as an optical waveguide in which no metal is included. On the contrary, the FDTD method may be applied to the entire structure in cases where a size of an optical device is very small with a complex metal-including internal structure or cases where a correct electromagnetic wave analysis of the entire analysis region is required.

Accordingly, when the BPM mode or the FDTD mode is selected by the mode selecting unit 270, a more efficient electromagnetic wave analysis may be performed by performing the electromagnetic wave analysis in only the BPM or the FDTD method without determining by the metal decision unit 250 whether a metallic or magnetic material is included in every BPM grid surface. Of course, when the hybrid mode is selected by the mode selecting unit 270, the electromagnetic wave analysis is performed by determining by the metal decision unit 250 whether a metallic or magnetic material is included in every BPM grid surface.

The hybrid optical simulator 200*a* may perform quickly and correctly a hybrid electromagnetic wave analysis of an analysis structure in any one of the BPM mode, the FDTD mode, and the hybrid mode according to the analysis structure by using the mode selecting unit 270.

Figure 5:
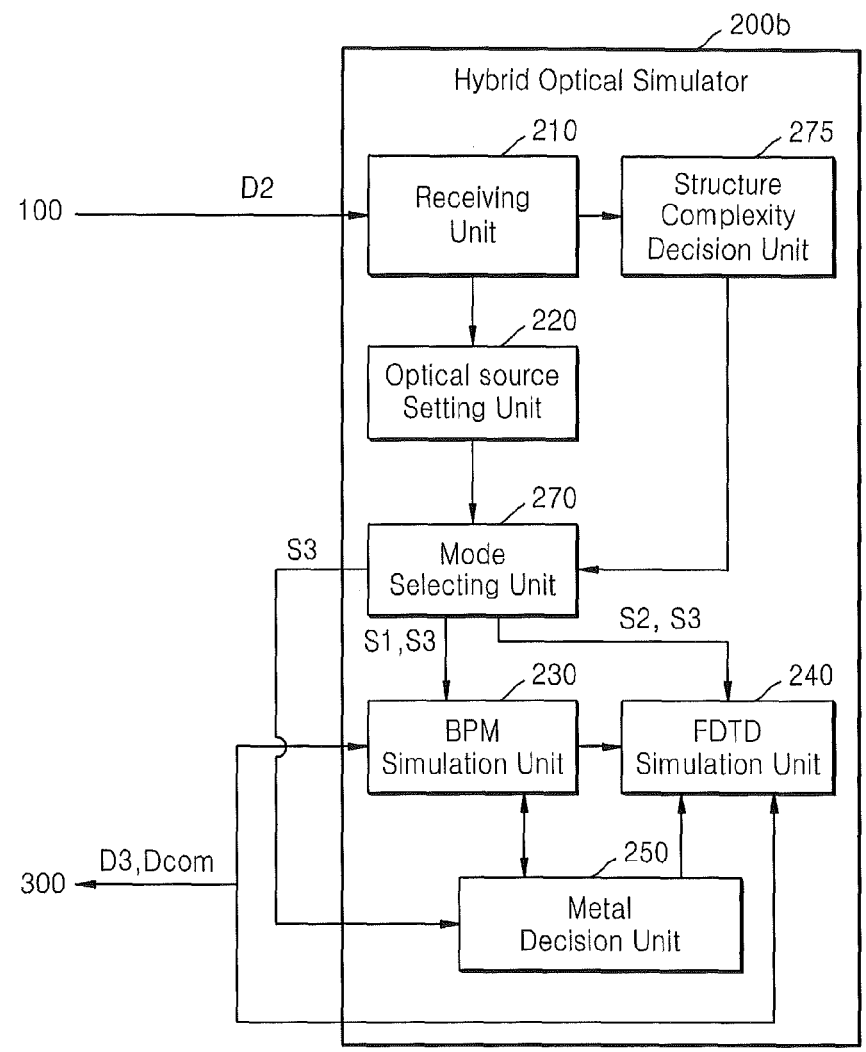

FIG. 5 is a block diagram of another modified example of the hybrid optical simulator 200 of FIG. 2, according to other embodiments described herein. For convenience of description, the description made with reference to FIG. 2 will be described in brief or omitted.

Referring to FIG. 5, a hybrid optical simulator 200*b* according to the current embodiment may further include the mode selecting unit 270 and a structure complexity decision unit 275. The mode selecting unit 270 may select any one of the BPM mode, the FDTD mode, and the hybrid mode, as described with reference to FIG. 4.

The structure complexity decision unit 275 may determine a complexity of an analysis structure. Various methods may be applied to calculate the complexity. For example, the complexity may be calculated by kinds of materials included per unit volume. Accordingly, the structure complexity decision unit 275 may determine that an optical waveguide has a low complexity in an analysis structure of the optical waveguide and a CMOS Image Sensor (CIS) or a solar cell has a high complexity.

Information regarding the complexity determined by the structure complexity decision unit 275 may be transmitted to the mode selecting unit 270. Accordingly, the mode selecting unit 270 may select a mode according to the complexity. For example, the BPM mode may be applied to an analysis structure with a low complexity and the FDTD mode may be applied to an analysis structure with a very high complexity. Of course, the mode selecting unit 270 does not select a mode by only the complexity. That is, the mode selecting unit 270 may select a mode based on various factors, such as a complexity, whether a metal is included, an analysis time, and an analysis accuracy.

Figure 6:
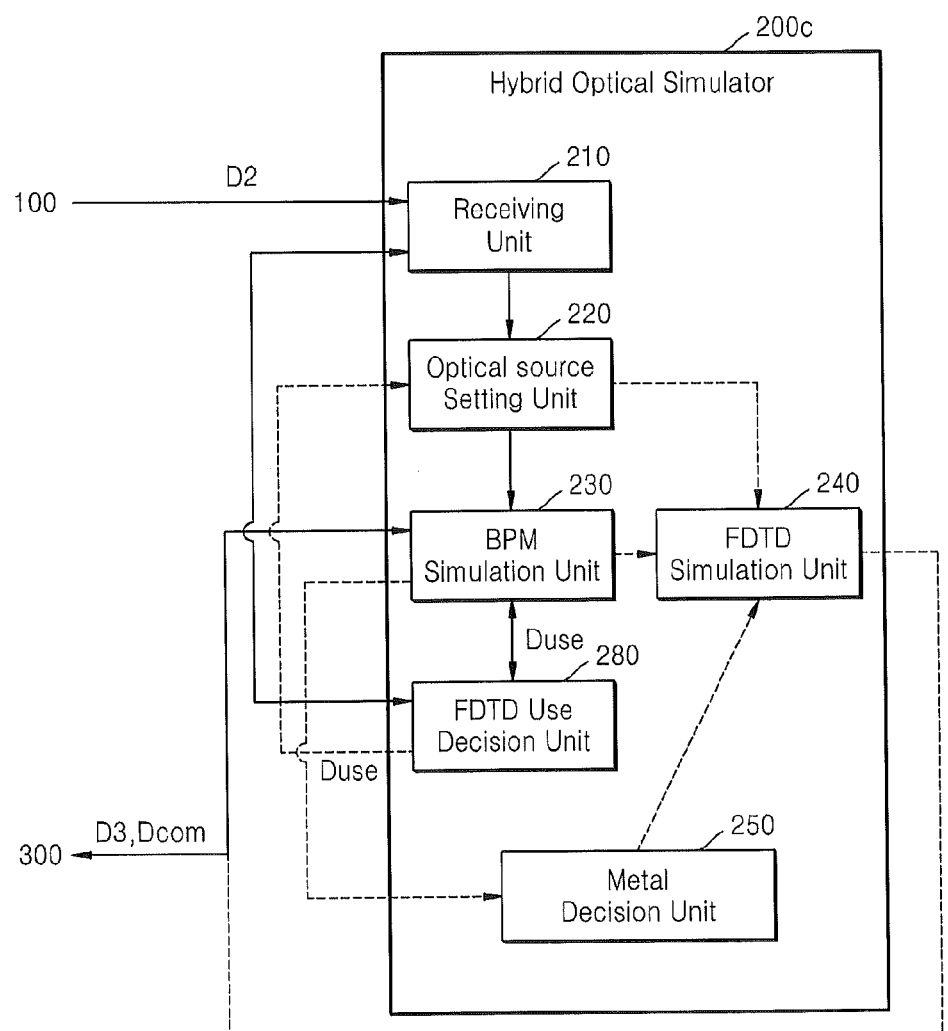

FIG. 6 is a block diagram of another modified example of the hybrid optical simulator 200 of FIG. 2, according to other embodiments described herein. For convenience of description, the description made with reference to FIG. 2 will be described in brief or omitted.

Referring to FIG. 6, a hybrid optical simulator 200*c* according to the current embodiment may further include an FDTD use decision unit 280. The FDTD use decision unit 280 determines whether the FDTD method is used. That is, the hybrid optical simulator 200*c* performs an electromagnetic wave analysis in the BPM mode as a default by using the BPM simulation unit 230. If a signal for using the FDTD method is output from the FDTD use decision unit 280 while performing the electromagnetic wave analysis in the BPM mode, the FDTD method is used together with the BPM mode. In FIG. 6, dashed arrows indicate paths of information inputs when the FDTD method is used.

When it is determined that the FDTD method is used, the hybrid optical simulator 200*c* may operate the same as described with reference to FIG. 2 or 3. The FDTD use decision unit 280 may transmit information regarding the use of the FDTD method to the BPM simulation unit 230 before performing the electromagnetic wave analysis of an analysis structure or at any time while performing the electromagnetic wave analysis in the BPM mode. In addition, the determination of the use of the FDTD method may be input to the FDTD use decision unit 280 via the UI 400 by a user or performed by the FDTD use decision unit 280 according to a predetermined criterion of the analysis structure.

Eventually, the hybrid optical simulator 200*c* may analyze an electromagnetic wave by using the BPM as a default but analyze an electromagnetic wave by using the FDTD method through an FDTD use decision when the use of the FDTD method is required due to an included metallic or magnetic material. That is, the hybrid optical simulator 200*c* may quickly and correctly perform an electromagnetic wave analysis by applying the BPM exclusively or flexibly applying the BPM and the FDTD method in a combined manner.

Figure 7:
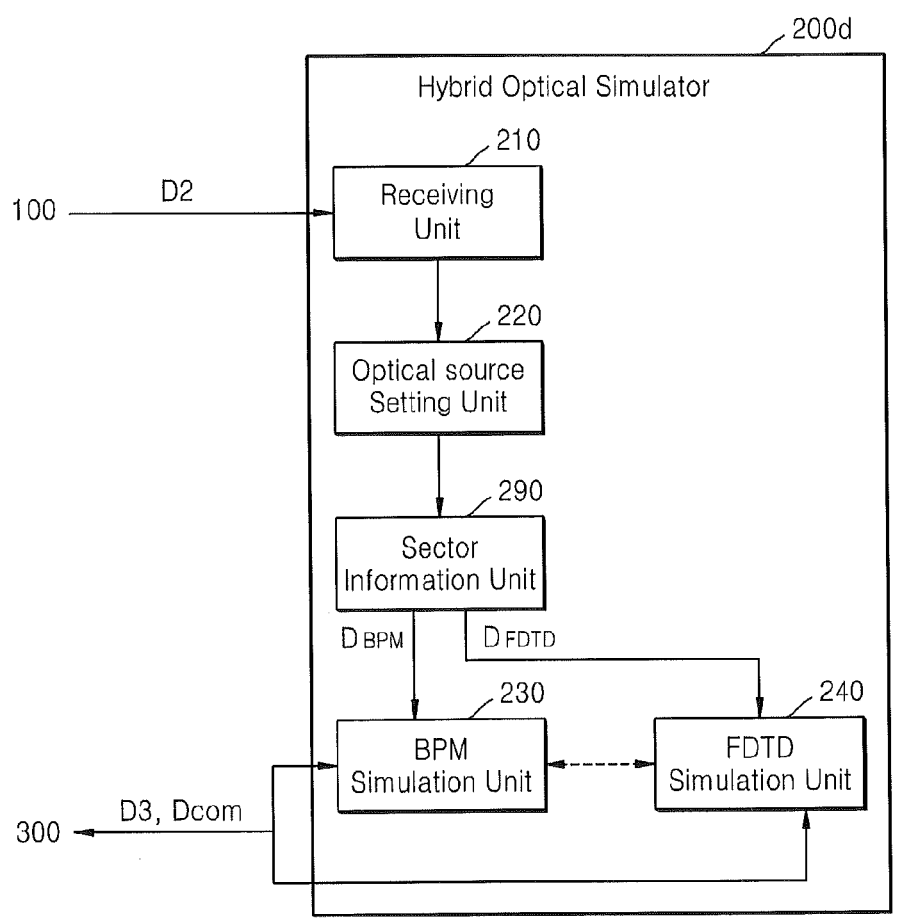

FIG. 7 is a block diagram of another modified example of the hybrid optical simulator 200 of FIG. 2, according to other embodiments described herein. For convenience of description, the description made with reference to FIG. 2 will be described in brief or omitted.

Referring to FIG. 7, a hybrid optical simulator 200*d* according to the current embodiment may further include a sector information unit 290. The sector information unit 290 may have sector information of an analysis structure, e.g., information regarding that a first sector of the analysis structure consists of only a dielectric material and a second sector further includes a metallic or magnetic material. The first and second sectors are concepts different from the BPM grid formed by the BPM simulation unit 230. For example, a part in which the dielectric material is continuously maintained may be identified as the first sector, and a part in which a metal is continuously maintained or the metal and the dielectric material are mixed may be identified as the second sector.

The sector information of an analysis structure output from the sector information unit 290 may be transmitted to the BPM simulation unit 230 or the FDTD simulation unit 240. That is, first sector information DBPM may be transmitted to the BPM simulation unit 230, and second sector information DFDTD may be transmitted to the FDTD simulation unit 240. Based on the first sector information DBPM and the second sector information DFDTD, the BPM simulation unit 230 may calculate an electric field by the BPM with respect to the first sector, i.e., the part in which only the dielectric material exists, and the FDTD simulation unit 240 may calculate an electric field by the FDTD method with respect to the second sector, i.e., the part in which a metallic or magnetic material is included. Of course, electric field data calculated by the BPM simulation unit 230 and electric field data calculated by the FDTD simulation unit 240 may be shared with each other (dashed arrow), and electric field data may be calculated by selectively applying the BPM or the FDTD method to each sector in a light-traveling direction.

The sector information of an analysis structure, which is included in the sector information unit 290, may be input to the sector information unit 290 via the UI 400 by a user or acquired by analyzing an input analysis structure in the sector information unit 290.

Because the hybrid optical simulator 200*d* applies the BPM or the FDTD method to each sector of an analysis structure by using the sector information unit 290, a metal decision unit for determining whether a metallic or magnetic material is included in each BPM grid surface is unnecessary. Accordingly, the hybrid optical simulator 200*d* may more quickly and correctly perform a hybrid electromagnetic analysis of an analysis structure.

Figure 8:
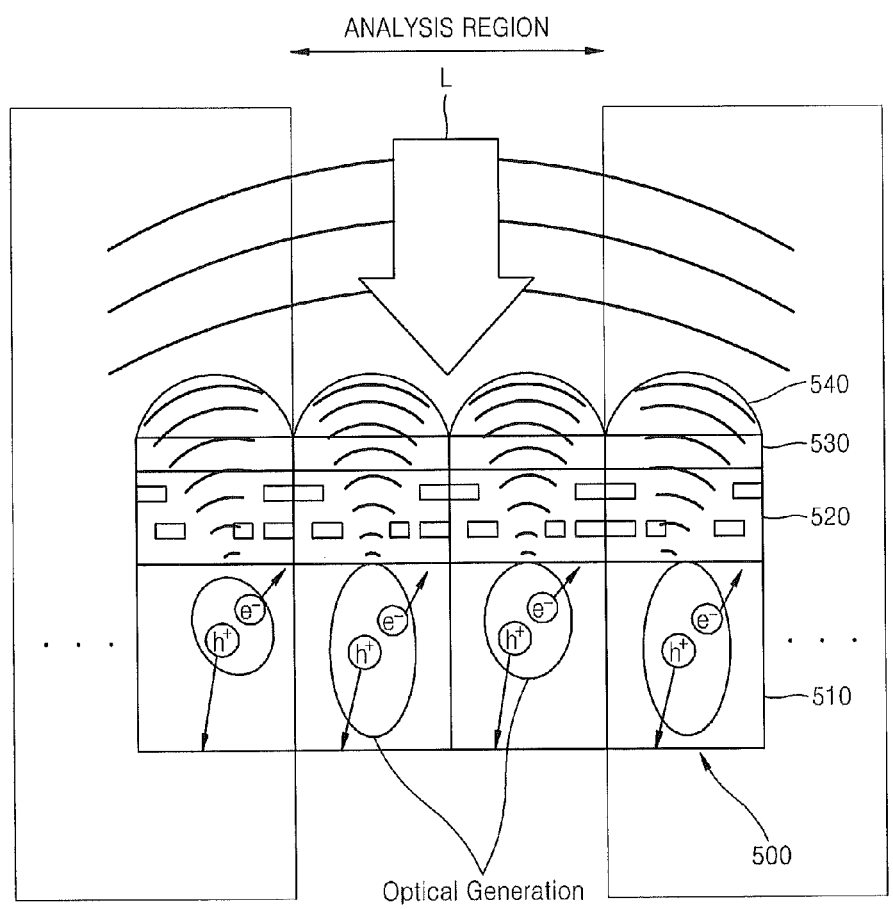
FIGS. 8 to 10 are schematic cross-sectional views of a CMOS Image Sensor (CIS) as a physical object to be analyzed to describe the concept of an electromagnetic wave analysis with respect to the electromagnetic wave analyzing apparatus according to various embodiments described herein.
Figure 9:
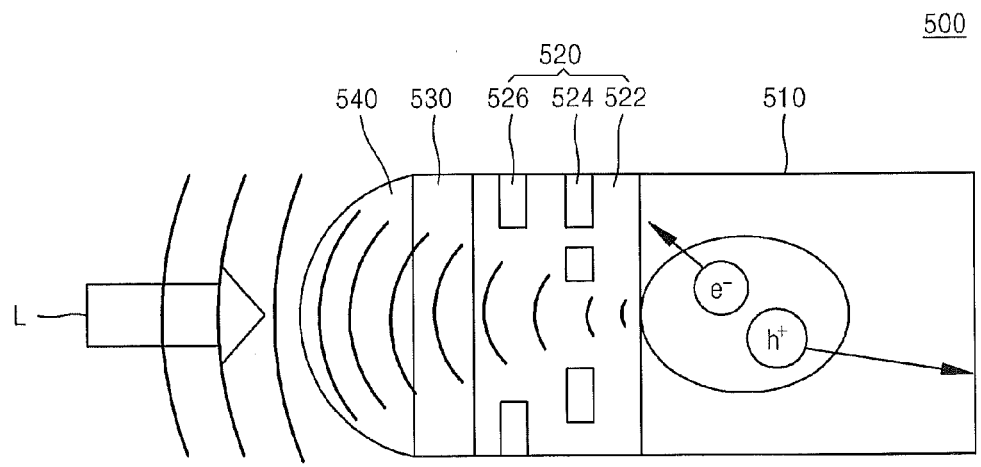
Figure 10:
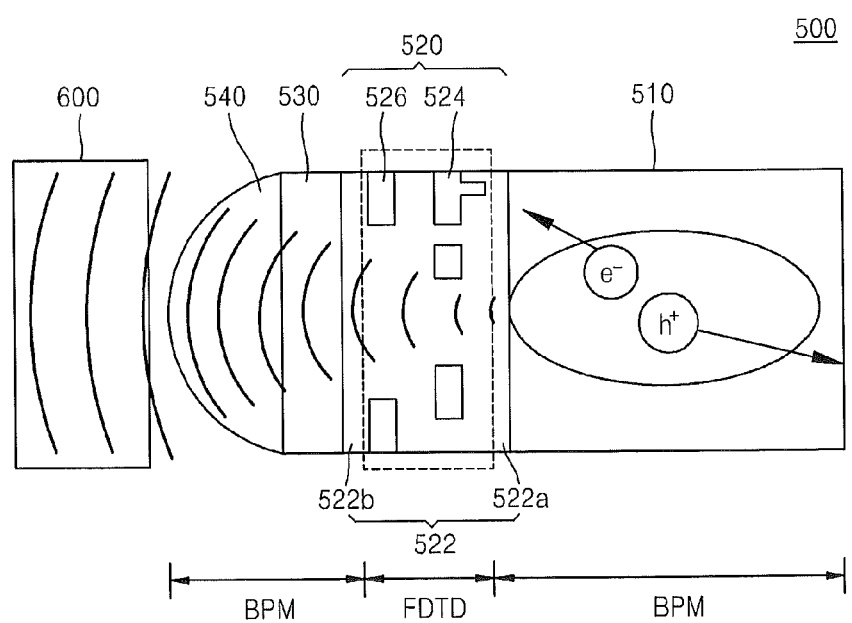

FIGS. 8 to 10 are schematic cross-sectional views of a CIS 500 as a physical object to be analyzed to describe the concept of an electromagnetic wave analysis with respect to the electromagnetic wave analyzing apparatus according to various embodiments described herein.

FIG. 8 is a schematic cross-sectional view of the CIS 500 as a physical object to be analyzed.

Referring to FIG. 8, the CIS 500 may be largely divided into a photo-diode region 510, a wiring layer 520, a filter layer 530, and a microlens 540. Light L is incident on the photo-diode region 510 by passing through the microlens 540, the filter layer 530, and the wiring layer 520, thereby generating current carriers through hole-electron pair generation in the photo-diode region 510. These generated current carriers, e.g., electrons, may be detected as an electrical signal through a circuit disposed around the CIS 500 to calculate the intensity or a wavelength of the incident light L.

To correctly understand the performance of the CIS 500, optical analysis capability, i.e., electromagnetic wave analysis capability, for correctly depicting and analyzing a phenomenon from the incident light L to the electrical signal generation is required. The electromagnetic wave analyzing apparatus according to the current embodiment may correctly analyze electromagnetic wave in the inside of CIS 500 by analyzing metal or magnetic material part and dielectric material part separately. Also, the electromagnetic wave analyzing apparatus according to the current embodiment may perform an analysis by forming an analysis structure by using the structure forming process simulator (100 of FIG. 1) for only a part corresponding to an analysis region after setting only a representative part as the analysis region for accuracy and quickness of the analysis instead of analyzing the entire structure of the CIS 500.

FIG. 9 is a magnified cross-sectional view of a portion of the analysis region to be analyzed in the CIS 500 of FIG. 8.

Referring to FIG. 9, a light traveling process is described in brief. The generated light L is incident on the microlens 540 and focused, and the focused optical beams are filtered according to their wavelengths by filters, e.g., red (R), green (G), and blue (B) filters, of the filter layer 530. The filtered optical beams pass through the wiring layer 520, which may include a plurality of layers of wiring lines 524 and 526 in a dielectric layer 522. The optical beams that have passed through the wiring layer 520 arrive at the photo-diode region 510, thereby inducing generation of a plurality of hole-electron pairs proportional to the intensity of the arriving optical beams. In general, the electrons of the generated holes and electrons are detected as an electrical signal for sensing the light L.

Through the above-described process, incident light causes electromagnetic phenomena, such as absorption, reflection, refraction, and scattering, in each part of a CIS. In particularly, reflection or scattering on a metallic wiring line occurs very significantly, and an induced current is generated on a metallic surface. Thus, if an electromagnetic wave, e.g., an electric field, of an internal structure of a CIS is correctly calculated, the correct performance of the CIS, e.g., the performance of hole-electron pair generation, may be correctly predicted, and accordingly, the optical detection performance of the CIS may be correctly predicted. In addition, problems of a structure or materials of a CIS may be perceived through an electromagnetic wave analysis of the CIS, and a better CIS may be implemented by employing a new structure or new materials.

FIG. 10 is a schematic cross-sectional view for describing in brief a process of analyzing the CIS 500 of FIG. 9 by using the electromagnetic wave analyzing apparatus according to various embodiments described herein.

Referring to FIG. 10, light is generated by a predetermined part, i.e., an optical source 600, as the optical source setting unit (200 of FIG. 2) sets. The generated light is incident on the CIS 500, and because the microlens 540, the filter layer 530, and an upper area 522b of the wiring layer 520 are generally formed with a dielectric material, an electromagnetic wave analysis may be performed by the BPM.

The electromagnetic wave analysis of an intermediate part of the wiring layer 520 including the metallic wiring lines 524 and 526 may be performed by the FDTD method. Although FIG. 10 shows that the electromagnetic wave analysis of parts between the metallic wiring lines 524 and 526 is also performed by the FDTD method, the electromagnetic wave analysis may vary according to an interval between the metallic wiring lines 524 and 526. For example, for a dielectric part at a position having a small influence due to reflection or an induced current by a metallic wiring line because of a large interval between the metallic wiring lines 524 and 526, an electric field may be analyzed by the BPM.

Because a metal layer is not included in a lower area 522a of the wiring layer 520 and the photo-diode region 510, the electromagnetic wave analysis may be performed by the BPM. Of course, for the photo-diode region 510, not only an electric field but also a hole-electron distribution may be analyzed.

Hereinafter, for convenience of understanding, the FDTD method is described in brief using equations.

The FDTD method is a method of alternately calculating electric field intensity and magnetic field intensity along a time axis by discretely arranging points for calculating the electric field intensity and points for calculating the magnetic field intensity in a virtual space in which a physical shape is defined, i.e., an analysis space. The electric field intensity and the magnetic field intensity are calculated using Maxwell's equations.

Maxwell's equations are fundamental equations for theoretically describing electromagnetic phenomena and include Equations 1 to 4.

$$\nabla \times B + \frac{\partial B}{\partial t} = 0 \quad (1)$$

$$\nabla \times H - \frac{\partial D}{\partial t} = J \quad (2)$$

$$\nabla \cdot D = \rho \quad (3)$$

$$\nabla \cdot B = 0 \quad (4)$$

Here, B denotes magnetic flux density at a time t and a position (x, y, z) of a 3D space, H denotes magnetic field intensity at the time t and the position (x, y, z), D denotes electric flux density at the time t and the position (x, y, z), J denotes current density at the time t and the position (x, y, z), and ρ denotes charge density at the time t and the position (x, y, z).

Equation 1 is an equation of Faraday's Law with respect to electromagnetic induction, Equation 2 is an equation of the extended Ampere's Law, and Equations 3 and 4 are equations of Gauss's Law with respect to an electric field and a magnetic field, respectively.

When Maxwell's equations are used, Equations 5 to 7 may be collaterally used.

$$D = \in E \quad (5)$$

$$B = \mu H \quad (6)$$

$$J = \sigma E \quad (7)$$

Here, E denotes electric field intensity at the certain time t and the position (x, y, z), ∈ denotes permittivity of a material at the position (x, y, z), μ denotes permeability of the material at the position (x, y, z), and σ denotes conductivity of the material at the position (x, y, z). Equations 5, 6, and 7 indicate a relationship between the electric flux density and the electric field intensity, a relationship between the magnetic flux density and the magnetic field intensity, and a relationship between the current density and the electric field intensity, respectively.

Equations 1 and 2 may be represented by Equations 8 and 9 by expressing them with only the electric field intensity E and the magnetic field intensity H by using Equations 3 to 7.

$$\frac{\partial H}{\partial t} = -\frac{1}{\mu}\nabla \times E \qquad (8)$$

$$\frac{\partial E}{\partial t} = -\frac{\sigma}{\varepsilon}E + \frac{1}{\varepsilon}\nabla \times H \qquad (9)$$

In Equations 8 and 9, the electric field intensity E and the magnetic field intensity H are functions of variables which are the position (x, y, z) and the time t, and the permittivity ∈, the permeability μ, and the conductivity σ are functions of a variable which is the position (x, y, z). Accordingly, the electric field intensity E and the magnetic field intensity H at the position (x, y, z) may be fundamentally obtained by solving the simultaneous equations, i.e., Equations 8 and 9, with respect to the time t.

In the FDTD method, the simultaneous equations, i.e., Equations 8 and 9, at the time t are solved by using a central difference method. A difference method obtains an approximate value by taking several discrete points on a variable axis, substituting a difference equation for a differential equation at a predetermined discrete point of a differentiable function, and solving the difference equation. For example, when it is assumed that the differentiable function is f(q) of which variables are q and q+r, the differential equation divides a difference between two differentiable functions, i.e., f(q+r)−f(q), by a difference value r. In addition, the central difference method is a method of obtaining a value of a function f(q) of a predetermined discrete point q by a difference between a function f(q+r/2) of a midpoint q+r/2 of the discrete point q and a next discrete point and a function f(q−r/2) of a midpoint q−r/2 of the discrete point q and a previous discrete point.

In the FDTD method, it is assumed that a time interval is Δt, discrete points are taken with an interval of Δt, and a time t is discrete. That is, it is assumed that the discrete points are taken at t=0, Δt, 2Δt, . . . , (n−1)Δt, . . . . When En and Hn denote the electric field intensity E and the magnetic field intensity H at a time t=nΔt, respectively, Equation 10 may be obtained by substituting a difference equation for the left side of Equation 8, i.e., a time differential with respect to the magnetic field intensity Hn at the time t=nΔt.

$$\frac{H^{n+\frac{1}{2}} - H^{n-\frac{1}{2}}}{\Delta t} = -\frac{1}{\mu}\nabla \times E^n \qquad (10)$$

In Equation 10, by considering that a calculation time of the magnetic field intensity H differs around a half hour interval from a calculation time of the electric field intensity E and substituting a difference equation for the left side of Equation 9, i.e., a time differential with respect to electric field intensity En−½ at a time t=(n−½)Δt, Equation 11 may be obtained.

$$\frac{E^n - E^{n-1}}{\Delta t} = -\frac{\sigma}{\varepsilon}E^{n-\frac{1}{2}} + \frac{1}{\varepsilon}\nabla \times H^{n-\frac{1}{2}} \qquad (11)$$

From a relationship between Equation 10 and Equation 11, an approximate equation of Equation 12 may be used by assuming that there is no half hour interval difference in the calculation time of the electric field intensity E.

$$E^{n-\frac{1}{2}} \approx \frac{E^n - E^{n-1}}{2} \qquad (12)$$

Equation 13 may be obtained by substituting Equation 12 into Equation 11.

$$\frac{E^n - E^{n-1}}{\Delta t} = -\frac{\sigma}{\varepsilon}\frac{E^n - E^{n-1}}{2} + \frac{1}{\varepsilon}\nabla \times H^{n-\frac{1}{2}} \qquad (13)$$

Equation 14 and Equation 15 may be obtained by modifying Equation 10 and Equation 13, respectively.

$$H^{n-\frac{1}{2}} = H^{n-\frac{1}{2}} - \frac{\Delta t}{\mu}\nabla \times E^n \qquad (14)$$

$$E^n = \frac{2\varepsilon - \sigma\Delta t}{2\varepsilon + \sigma\Delta t}E^{n-1} + \frac{2\Delta t}{2\varepsilon + \sigma\Delta t}\nabla \times H^{n-\frac{1}{2}} \qquad (15)$$

As described above, by modifying a time differential by using a difference equation, Maxwell's equations are modified to Equations 14 and 15. Thereafter, electric field intensity and magnetic field intensity in each discrete point are obtained by making a space discrete to solve a spatial differential. It is noted that points for calculating the electric field intensity and points for calculating the magnetic field intensity are discretely arranged in an electromagnetic field.

The spatial differential may be calculated by substituting a difference equation for a differential with respect to (i, j, k) that are x, y, and z components, respectively. That is, spatial differentials with respect to an electric field and a magnetic field may be rewritten to Equations 16 and 17.

$$\nabla \times E^n = \left(\frac{\partial E_z^n}{\partial y} - \frac{\partial E_y^n}{\partial z}\right)i + \left(\frac{\partial E_x^n}{\partial z} - \frac{\partial E_z^n}{\partial x}\right)j + \left(\frac{\partial E_y^n}{\partial x} - \frac{\partial E_x^n}{\partial y}\right)k \qquad (16)$$

$$\nabla \times H^n = \left(\frac{\partial H_z^n}{\partial y} - \frac{\partial H_y^n}{\partial z}\right)i + \left(\frac{\partial H_x^n}{\partial z} - \frac{\partial H_z^n}{\partial x}\right)j + \left(\frac{\partial H_y^n}{\partial x} - \frac{\partial H_x^n}{\partial y}\right)k \qquad (17)$$

By using Equation 16, a z component of Equation 14 may be represented by Equation 18.

$$H_z^{n+\frac{1}{2}} = H_z^{n-\frac{1}{2}} - \frac{\Delta t}{\mu}\left(\frac{\partial E_y^n}{\partial x} - \frac{\partial E_x^n}{\partial y}\right) \qquad (18)$$

Equation 19 is obtained by assuming that intervals in an x-axis direction, a y-axis direction, and a z-axis direction are Δx, Δy, and Δz, respectively, and substituting difference equations for differentials with respect to x and y components of the electric field intensity E.

$$H_z^{n+\frac{1}{2}}\left(i+\frac{1}{2},j+\frac{1}{2},k\right) = H_z^{n-\frac{1}{2}}\left(i+\frac{1}{2},j+\frac{1}{2},k\right) - \tag{19}$$

$$\frac{\Delta t}{\mu}\left(\frac{E_y^n\left(i+\frac{1}{2},j+1,k\right)-E_y^n\left(i+\frac{1}{2},j,k\right)}{\Delta x}\right)+$$

$$\frac{\Delta t}{\mu}\left(\frac{E_x^n\left(i+1,j+\frac{1}{2},k\right)-E_x^n\left(i,j+\frac{1}{2},k\right)}{\Delta y}\right)$$

By the same principle as Equation 19, a y component of Equation 14 related to a magnetic field calculation point at a position (i+½, j, k+½) is represented by Equation $$H_y^{n+\frac{1}{2}}\left(i+\frac{1}{2},j,k+\frac{1}{2}\right) = H_y^{n+\frac{1}{2}}\left(i+\frac{1}{2},j,k+\frac{1}{2}\right) - \tag{20}$$

$$\frac{\Delta t}{\mu}\left(\frac{E_x^n\left(i+1,j,k+\frac{1}{2}\right)-E_x^n\left(i,j,k+\frac{1}{2}\right)}{\Delta z}\right)+$$

$$\frac{\Delta t}{\mu}\left(\frac{E_z^n\left(i+\frac{1}{2},j,k+1\right)-E_z^n\left(i+\frac{1}{2},j,k\right)}{\Delta x}\right)$$

In addition, an x component of Equation 14 related to a magnetic field calculation point at a position (i, j+½, k+½) is represented by Equation 21.

$$H_x^{n+\frac{1}{2}}\left(i,j+\frac{1}{2},k+\frac{1}{2}\right) = H_x^{n-\frac{1}{2}}\left(i,j+\frac{1}{2},k+\frac{1}{2}\right) - \tag{21}$$

$$\frac{\Delta t}{\mu}\left(\frac{E_z^n\left(i,j+\frac{1}{2},k+1\right)-E_z^n\left(i,j+\frac{1}{2},k\right)}{\Delta y}\right)+$$

$$\frac{\Delta t}{\mu}\left(\frac{E_y^n\left(i,j+1,k+\frac{1}{2}\right)-E_y^n\left(i,j,k+\frac{1}{2}\right)}{\Delta z}\right)$$

In the FDTD method, the magnetic field intensity H at each time with respect to a magnetic field calculation point may be calculated using any one of the three expanded expressions, i.e., Equations 19 to 21.

An x component of Equation 15 is represented by Equation 22 by using Equation 17.

$$E_x^n = \frac{2\varepsilon - \sigma\Delta t}{2\varepsilon + \sigma\Delta t}E_x^{n-1} + \frac{2\Delta t}{2\varepsilon + \sigma\Delta t}\left(\frac{\partial H_z^{n-\frac{1}{2}}}{\partial y} - \frac{\partial H_y^{n-\frac{1}{2}}}{\partial z}\right) \tag{22}$$

Equation 22 with respect to an electric field calculation point at a position (i+½, j, k) is represented by Equation 23 by substituting difference equations for differentials with respect to the y and z components of the magnetic field intensity H.

$$E_x^n\left(i+\frac{1}{2},j,k\right) = \frac{2\varepsilon - \sigma\Delta t}{2\varepsilon + \sigma\Delta t}E_x^{n-1}\left(i+\frac{1}{2},j,k\right) + \tag{23}$$

-continued $$\frac{2\Delta t}{2\varepsilon + \sigma\Delta t}\left(\frac{H_z^{n-\frac{1}{2}}\left(i+\frac{1}{2},j,k+\frac{1}{2}\right)-H_z^{n-\frac{1}{2}}\left(i+\frac{1}{2},j,k-\frac{1}{2}\right)}{\Delta y}\right)-$$

$$\frac{2\Delta t}{2\varepsilon + \sigma\Delta t}\left(\frac{H_y^{n-\frac{1}{2}}\left(i+\frac{1}{2},j+\frac{1}{2},k\right)-H_y^{n-\frac{1}{2}}\left(i+\frac{1}{2},j-\frac{1}{2},k\right)}{\Delta z}\right)$$

By the same principle as Equation 23, a y component of Equation 15 related to an electric field calculation point at a position (i, j+½, k) is represented by Equation 24.

$$E_y^n\left(i,j+\frac{1}{2},k\right) = \frac{2\varepsilon - \sigma\Delta t}{2\varepsilon + \sigma\Delta t}E_y^{n-1}\left(i,j+\frac{1}{2},k\right) + \tag{24}$$

$$\frac{2\Delta t}{2\varepsilon + \sigma\Delta t}\left(\frac{H_x^{n-\frac{1}{2}}\left(i+\frac{1}{2},j+\frac{1}{2},k\right)-H_x^{n-\frac{1}{2}}\left(i-\frac{1}{2},j+\frac{1}{2},k\right)}{\Delta z}\right)-$$

$$\frac{2\Delta t}{2\varepsilon + \sigma\Delta t}\left(\frac{H_z^{n-\frac{1}{2}}\left(i,j+\frac{1}{2},k+\frac{1}{2}\right)-H_z^{n-\frac{1}{2}}\left(i,j+\frac{1}{2},k-\frac{1}{2}\right)}{\Delta x}\right)$$

In addition, a z component of Equation 15 related to an electric field calculation point at a position (i, j, k+½) is represented by Equation 25.

$$E_z^n\left(i,j,k+\frac{1}{2}\right) = \frac{2\varepsilon - \sigma\Delta t}{2\varepsilon + \sigma\Delta t}E_z^{n-1}\left(i,j,k+\frac{1}{2}\right) + \tag{25}$$

$$\frac{2\Delta t}{2\varepsilon + \sigma\Delta t}\left(\frac{H_y^{n-\frac{1}{2}}\left(i,j+\frac{1}{2},k+\frac{1}{2}\right)-H_y^{n-\frac{1}{2}}\left(i,j-\frac{1}{2},k+\frac{1}{2}\right)}{\Delta x}\right)-$$

$$\frac{2\Delta t}{2\varepsilon + \sigma\Delta t}\left(\frac{H_x^{n-\frac{1}{2}}\left(1+\frac{1}{2},j,k+\frac{1}{2}\right)-H_x^{n-\frac{1}{2}}\left(i-\frac{1}{2},j,k+\frac{1}{2}\right)}{\Delta y}\right)$$

In the FDTD method, the electric field intensity E at each time with respect to a magnetic field calculation point may be calculated using any one of the three expanded expressions, i.e., Equations 23 to 25.

As a reference, for the BPM, because it is assumed that an electric field and a magnetic field are not changed with respect to time, the time differential described above does not have to be considered. In addition, for the FFT-BPM, a kind of BPM, an electric field may be more quickly calculated by performing a calculation in a frequency domain on each grid surface by using FFT and performing Inverse FFT (IFFT).

The electromagnetic wave analyzing apparatus according to the current embodiment may quickly and correctly perform an electromagnetic wave analysis of a CIS by dividing a structure of the CIS into a metallic part and a non-metallic part and selectively applying the FDTD method and the BPM to the metallic part and the non-metallic part, respectively.

Although a CIS has been described as an optical apparatus to be analyzed, the electromagnetic wave analyzing apparatus according to the current embodiment is not limited to the CIS of a several-micrometer size and may be able to analyze an electromagnetic wave of all optical devices or optical apparatuses for which light is incident on the inside thereof. For example, the electromagnetic wave analyzing apparatus according to the current embodiment may quickly and correctly perform an electromagnetic wave analysis of Optical Interconnect (OI) apparatuses and solar cells of hundreds micrometer size. In addition, the electromagnetic wave analyzing apparatus according to the current embodiment may quickly and correctly perform an electromagnetic wave analysis of optical devices or apparatuses used for optical communication, such as optical modulation devices, light-receiving devices, light-emitting devices, optical fibers, optical waveguides, optical couplers, and optical waveguide interferometers, and optical devices, such as photo-diodes, optical crystal structures, and masks.

Figure 11A:
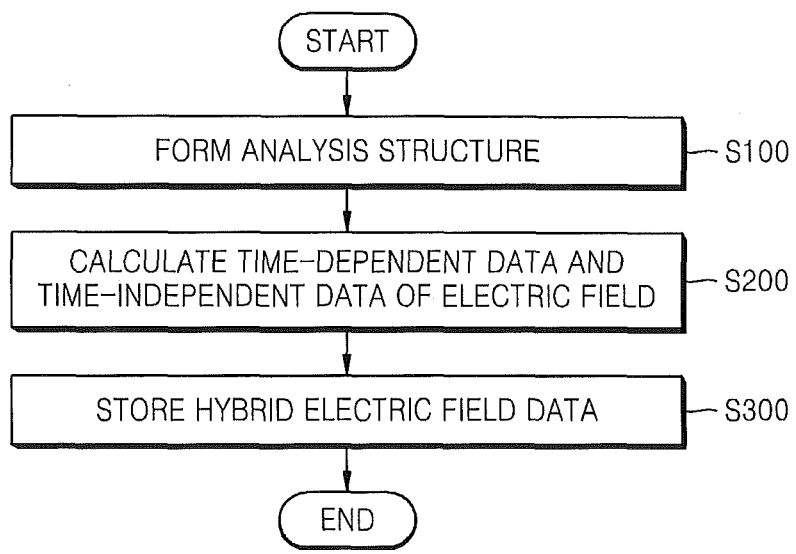
FIGS. 11A and 11B are flowcharts illustrating analyzing an electromagnetic wave, according to various embodiments described herein.

FIG. 11A is a flowchart illustrating analyzing an electromagnetic wave, according to various embodiments described herein.

Referring to FIG. 11, in operation S100, the structure forming process simulator (100 of FIG. 1) forms an analysis structure of an optical device to be analyzed. As described above, the analysis structure may be a 3D simulation structure formed by reflecting characteristics of a corresponding optical device in a 3D virtual space instead of an actual physical structure. Accordingly, the analysis structure may include not only information regarding a shape of the optical device but also information regarding an analysis region and information regarding refractive indexes of materials of each part of the analysis structure.

In operation S200, the hybrid optical simulator (200 of FIG. 1) calculates time-dependent data and time-independent data of an electric field with respect to the analysis structure by receiving the analysis structure from the structure forming process simulator (100 of FIG. 1). The calculation of the time-dependent data and the time-independent data of an electric field involves calculating the time-independent data of the electric field by the BPM with respect to the analysis structure and calculating the time-dependent data of the electric field by the FDTD method with respect to the analysis structure. The BPM may be applied to a dielectric part of the analysis structure, and the FDTD method may be applied to a part in which a metallic or magnetic material is included.

In operation S300, the time-dependent data and the time-independent data of an electric field are stored in the storage device 300 as hybrid electric field data. The hybrid electric field data may include any one of the time-independent data and the time-dependent data of an electric field. The hybrid electric field data may be used by the structure forming process simulator (100 of FIG. 1) to transform the analysis structure.

Figure 11B:
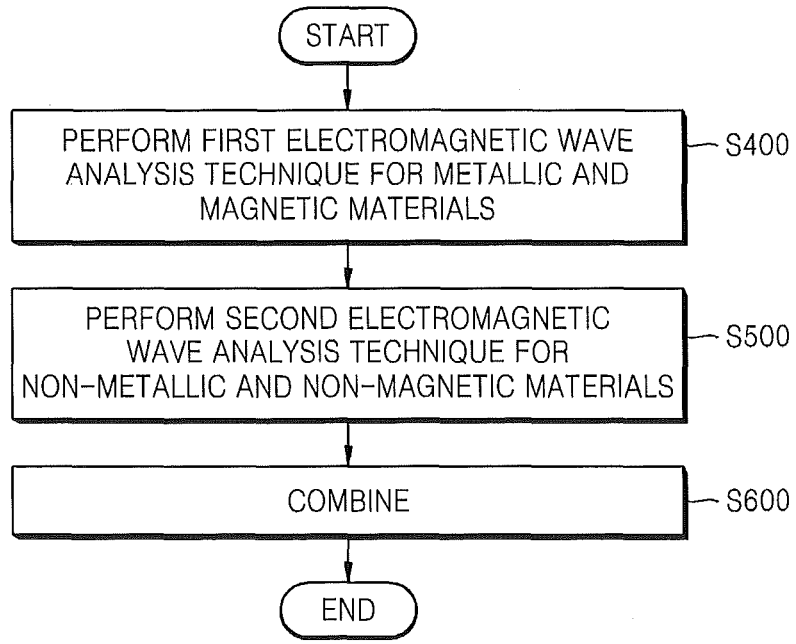

FIG. 11B is a flowchart illustrating analyzing an electromagnetic wave according to various other embodiments described herein. In embodiments of FIG. 11B, an analysis structure need not be formed as was described at Block S100 of FIG. 11A. Rather, an analysis structure may be provided using other analysis tools. Referring now to Block S400, a first electromagnetic wave analysis technique, such as a time dependent electromagnetic wave analysis technique including FDTD, is performed for metallic and magnetic materials in a physical object to be analyzed, for example by performing FDTD on the representations of metallic and magnetic materials in the analysis structure. At Block S500, a second electromagnetic wave analysis technique, which may be a time independent electromagnetic wave analysis technique including BPM, is performed for non-metallic and non-magnetic materials in the physical object to be analyzed, for example by performing BPM on representations of non-metallic and non-magnetic materials in the analysis structure. Then, at Block S600, the results of the first electromagnetic wave analysis technique (Block S400) and the second electromagnetic wave analysis technique (Block S500) are combined, for example according to various embodiments described herein, to thereby analyze the electromagnetic wave that is produced by the physical object. Blocks S400, S500 and/or S600 are performed in a data processor, for example in a hybrid optical simulator, as was described above. Moreover, the results may be stored as was described at Block S300 of FIG. 11A.

Figure 12:
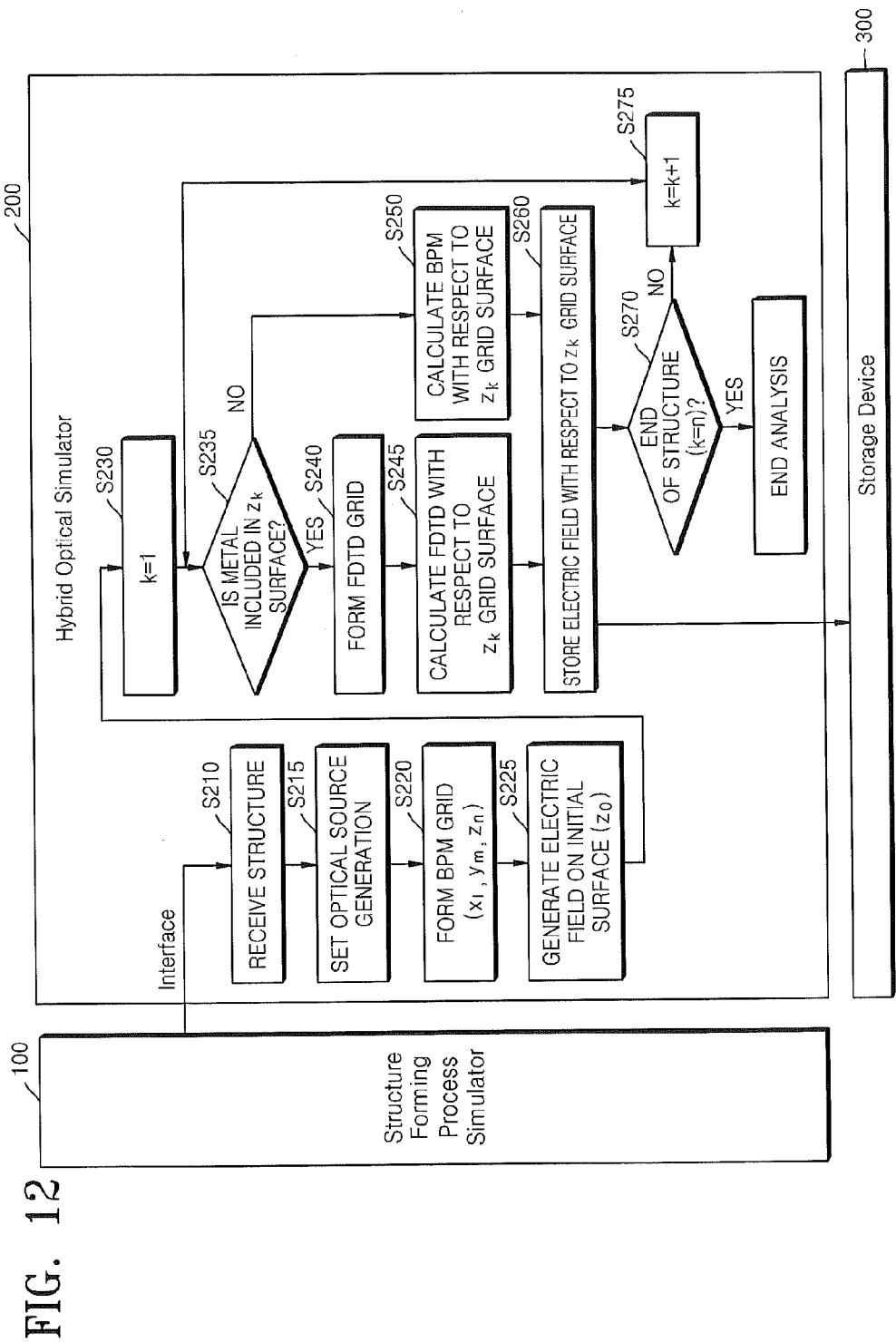
FIG. 12 is a flowchart illustrating analyzing an electromagnetic wave, according to various embodiments described herein, which is shown together with a structure forming process simulator of the electromagnetic wave analyzing apparatus of FIG. 1.

FIG. 12 is a flowchart illustrating a method of analyzing an electromagnetic wave, according to various embodiments described herein, which is shown together with the structure forming process simulator 100 of the electromagnetic wave analyzing apparatus of FIG. 1.

Referring to FIG. 12, in operation S210, an analysis structure formed by the structure forming process simulator (100 of FIG. 1) is received from the structure forming process simulator (100 of FIG. 1). The analysis structure may be an analysis structure of the entire optical device or an analysis structure of a portion of the optical device, as described above.

In operation S215, the optical source setting unit (220 of FIG. 2) sets optical source generation, based on the received analysis structure. The optical source generation setting indicates that values of an incident angle, a polarization, a wavelength, and an intensity of light are properly set according to the analysis structure.

After setting the optical source generation, a BPM grid (xl, ym, zn) of the analysis structure is formed in operation S220. The BPM grid is formed by the BPM simulation unit (230 of FIG. 2), and an interval in each direction of the BPM grid may be set to around 20 nm. However, the interval is not limited thereto. The z-axis direction may be defined as a light-traveling direction, and an index k may be set as a variable with respect to each grid surface in the z-axis direction. An initial surface z0 in which k=0 may be a surface on which light. i.e., an electric field, is generated.

After forming the BPM grid, an electric field is generated on the initial surface z0 in operation S225. It is assumed that the generated electric field travels in the z-axis direction, as described above. Although an electric field generally travels in x-, y-, and z-axes directions in 3D, the electric field may be generated as a plane wave traveling in the z-axis direction for analysis. The initial surface z0 on which the electric field is generated may be apart from the analysis structure by a predetermined distance.

In operation S230, the index k is assigned to a value of 1. That is, a first grid surface among a plurality of BPM grid surfaces is selected. The first grid surface may be a grid surface most adjacent to the analysis structure. Hereinafter, "grid surface" indicates a BPM grid surface.

In operation S235, it is determined whether a kth grid surface includes a metallic or magnetic material. For example, when k is 1, it is determined whether the first grid surface includes a metallic or magnetic material. Whether a metallic or magnetic material is included may be determined by a refractive index. However, the determination of whether a metallic or magnetic material is included is not limited to the determination according to a refractive index.

If the kth grid surface does not include a metallic or magnetic material, an electric field with respect to the kth grid surface is calculated in the BPM in operation S250. As described above, the electric field data calculated in the BPM may be time-independent data.

After completing the electric field calculation with respect to the kth grid surface, the electric field data with respect to the kth grid surface is stored in operation S260. The electric field data may be stored in the temporary memory (260 of FIG. 3) in the hybrid optical simulator (200 of FIG. 1) or the storage device (300 of FIG. 1).

In operation S270, it is determined whether the kth grid surface is the end of the analysis structure. The determination of whether the kth grid surface is the end of the analysis structure may be performed by checking an index number corresponding to the end of the analysis structure when the BPM grid is formed for the first time. For example, if an index of a grid surface corresponding to the end of the analysis structure is n, the end of the analysis structure may be determined by comparing k with n.

If the kth grid surface is the end of the analysis structure, the analysis process ends. Otherwise, if the kth grid surface is not the end of the analysis structure, k is increased by 1 in operation S275. After increasing k by 1, the analysis process proceeds to operation S235 to determine whether the kth grid surface includes a metallic or magnetic material.

If it is determined in operation S235 that the kth grid surface includes a metallic or magnetic material, an FDTD grid is formed with respect to the kth grid surface in operation S240. The FDTD grid may have a smaller interval than that of the BPM grid. For example, the interval of the FDTD grid may be several nanometers. However, the interval of the FDTD grid may be properly set by a user according to an analysis structure. For convenience of description, for the FDTD grid, FDTD grid surfaces may also be defined in the z-axis direction.

In operation S245, electric field data with respect to the kth grid surface is calculated in the FDTD method. The electric field data calculated in the FDTD method may be time-dependent data. As described above, both electric field data and magnetic field data may be calculated in the FDTD method. In addition, electric field data regarding all FDTD grid surfaces formed with respect to the kth grid surface may be calculated in the FDTD method.

In operation S260, the electric field data calculated in the FDTD method with respect to the kth grid surface is stored as time-dependent data. The electric field data calculated in the FDTD method may also be stored in the temporary memory (260 of FIG. 3) or the storage device (300 of FIG. 1). Because the magnetic field data calculated in the FDTD method is not necessary for the analysis structure, the magnetic field data is deleted, and only the electric field data may be stored in the storage device (300 of FIG. 1) as time-dependent data.

After storing the time-dependent data, it is determined in operation S270 whether the kth grid surface is the end of the analysis structure. If the kth grid surface is the end of the analysis structure, the analysis process ends. Otherwise, if the kth grid surface is not the end of the analysis structure, k is increased by 1 in operation S275. After increasing k by 1, the analysis process proceeds to operation S235 to determine whether the kth grid surface includes a metallic or magnetic material.

Electromagnetic wave analyzing methods according to the current embodiment may be able to quickly and correctly perform an electromagnetic wave analysis of an optical device to be analyzed, by analyzing an electric field by selectively using the BPM or the FDTD method according to whether a metallic or magnetic material is included. For example, comparing with an analysis result using only the FDTD method, the electromagnetic wave analyzing method according to the current embodiment may secure an accuracy more than about 90%. In addition, in terms of speed, the electromagnetic wave analyzing method according to the current embodiment may derive a result in a more than several to ten times faster speed than that when the FDTD method is exclusively used. Actually, when a result obtained by using the electromagnetic wave analyzing method according to the current embodiment with regard to CIS is compared with a result obtained by using only the FDTD method with regard to CIS, it is verified that the electromagnetic wave analyzing method according to the current embodiment performs an analysis at a 20 to 70 times faster speed. Furthermore, the electromagnetic wave analyzing method according to the current embodiment may use an analysis structure for applying the BPM or the FDTD method as it is without separately setting another optical structure, i.e., another analysis structure. By combined use of the BPM and the FDTD method, an electromagnetic wave analysis may be quickly and correctly performed with respect to not only optical devices including only dielectric materials but also optical devices further including metallic materials.

FIGS. 13 to 20 are perspective views and images for describing procedures of the flowchart of FIG. 12 with respect to the CIS 500 that is a physical object to be analyzed.

Figure 13:
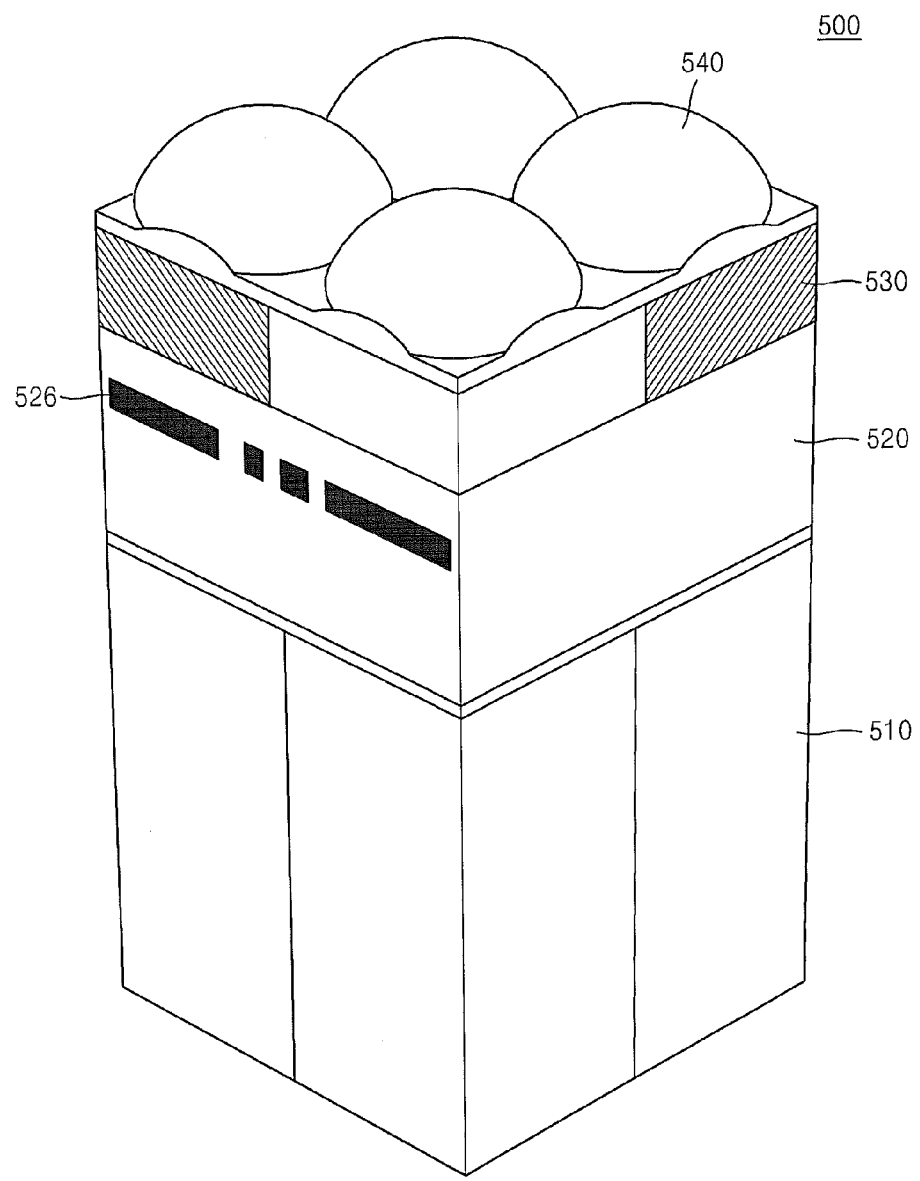
FIGS. 13 to 20 are perspective views and images for describing procedures of the flowchart of FIG. 12 with respect to the CIS that is a physical object to be analyzed.

FIG. 13 is a perspective view corresponding to the receiving of the analysis structure in operation S210 and shows an analysis structure formed in 3D with respect to an analysis region of the CIS 500. From the top, the microlens 540, the filter layer 530, the wiring layer 520, and the photo-diode region 510 are disposed. A black hatching part in the middle of the wiring layer 520 may be the upper metallic wiring line 526.

Figure 14:
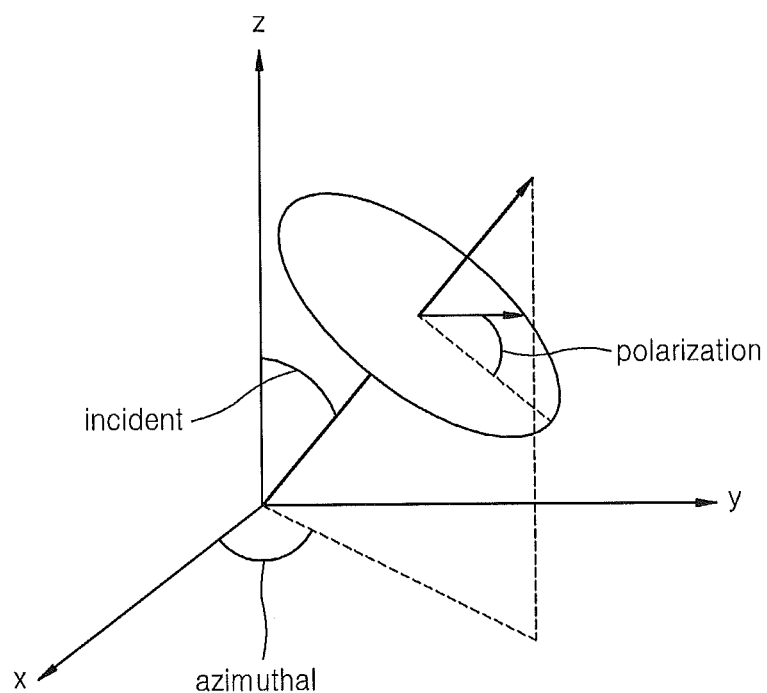

FIG. 14 is a diagram corresponding to the setting of the optical source generation in operation S215 and conceptually shows an incident angle, an azimuth angle, and a polarization angle of light. Of course, in the setting of the optical source generation, not only a direction and polarization of light but also a wavelength and an intensity of the light are set.

Figure 15:
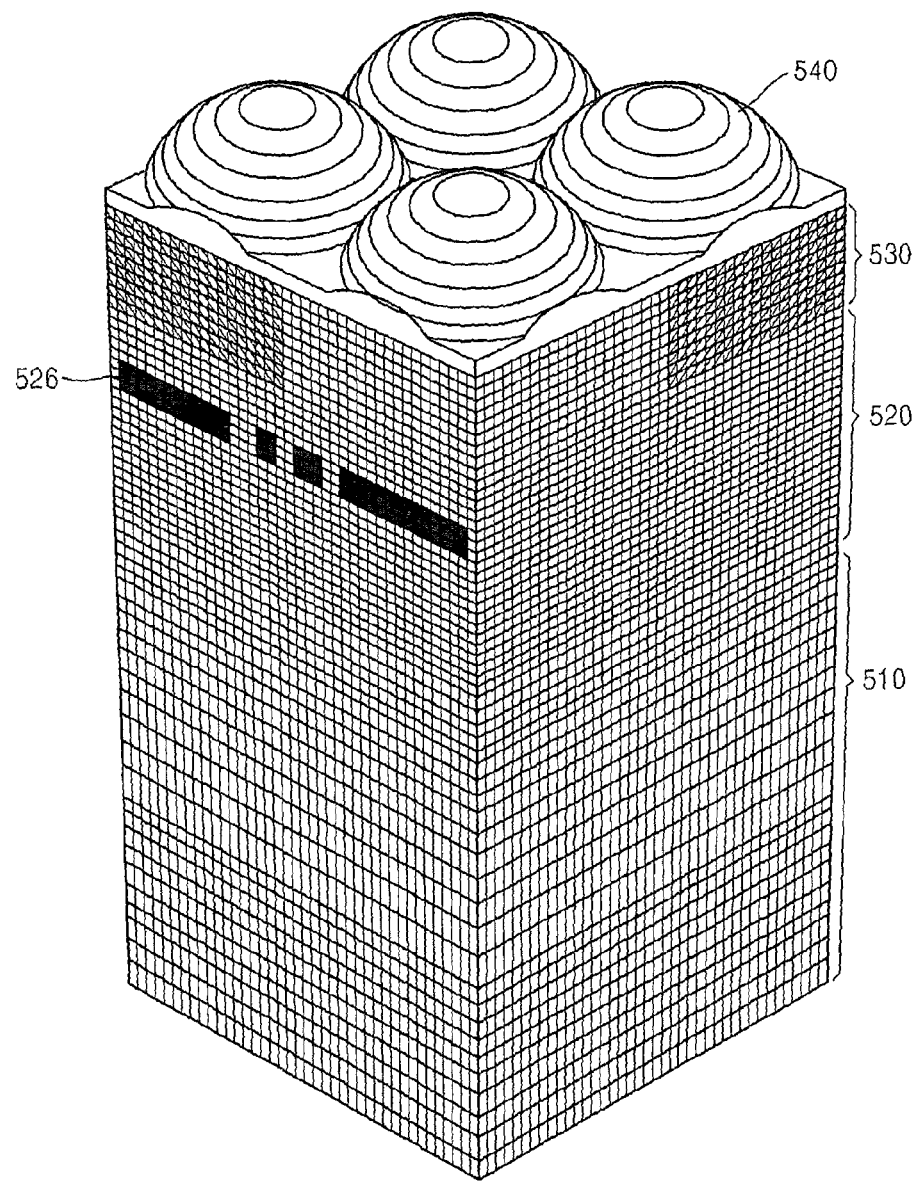

FIG. 15 is a perspective view corresponding to the forming of the BPM grid in operation S220 and shows that the BPM grid is very densely formed with respect to the analysis structure of the CIS 500. The BPM grid may be formed with an interval of 20 nm. Of course, the interval of the BPM grid may vary according to an analysis structure of a device to be analyzed. The BPM grid may be formed with a uniform interval or non-uniform intervals. As shown in FIG. 13, in the current embodiment, a grid with a uniform narrow interval may be formed in the wiring layer 520 and the filter layer 530, and a grid with non-uniform wide intervals may be formed in the photo-diode region 510.

Figure 16:
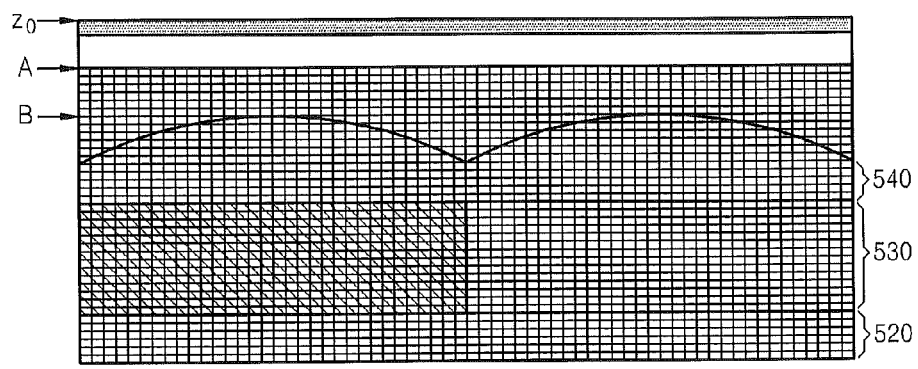

FIG. 16 is a partial front view corresponding to the generating of the electric field in operation S225, wherein light is generated on the initial surface z0. The generation of light is a concept of virtually generating an electric field having optical characteristics set in the setting of the optical source generation as a plane wave traveling in the z-axis direction instead of a concept of actually generating light.

The initial surface z0 on which the light is generated may be apart from the analysis structure by a predetermined distance, e.g., the microlens 540. The first grid surface among the plurality of BPM grid surfaces may be a grid surface at a position A apart by a predetermined distance from the microlens 540 or a grid surface at a position B immediately adjacent to the microlens 540. Although the first grid surface is generally set at a position apart by a predetermined distance from the analysis structure, when no particular materials exist between the analysis structure and the initial surface z0, e.g., when a vacuum exists between the analysis structure and the initial surface z0, the first grid surface may be formed adjacent to the analysis structure.

Figure 17:
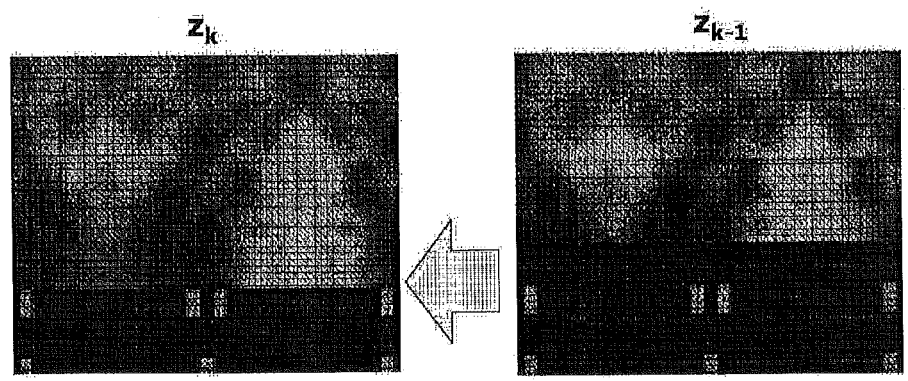

FIG. 17 shows simulation images corresponding to the calculating of the electric field by the BPM in operation S250, which shows distributions of the electric field calculated in the BPM with respect to a (k−1)th grid surface (the right picture) and then a kth grid surface (the left picture) when a metallic or magnetic material is not included in the (k−1)th grid surface and the kth grid surface. In FIG. 17, lower dark parts are parts for which an analysis has not been performed.

Although an interval between the (k−1)th grid surface and the kth grid surface is very wide in the right and left simulation images, this is for convenience of understanding, and an interval between grid surfaces may be generally very narrow. In the current embodiment, the BPM method may analyze an electric field by using a method of analyzing the electric field through a FFT on a corresponding kth grid surface, i.e., the FFT-BPM.

Figure 18A:
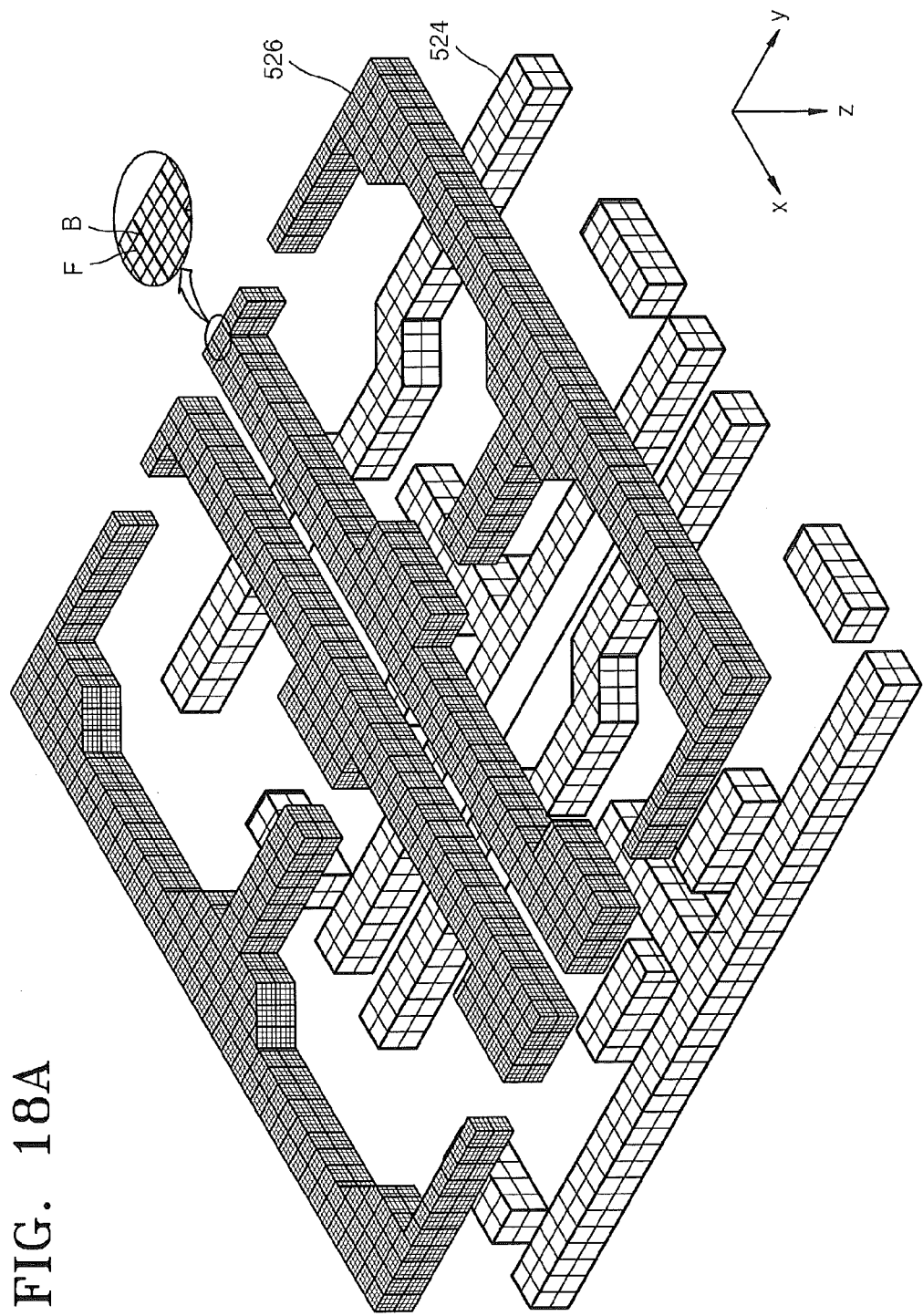

FIG. 18A is a perspective view corresponding to the forming of the FDTD grid when the kth grid surface includes a metallic or magnetic material and shows that an FDTD grid (thin solid line, F) with a very narrow interval is formed in the upper metallic wiring line 526 when the upper metallic wiring line 526 belongs to the kth grid surface. As described above, the interval of the FDTD grid may be smaller than that of a BPM grid (thick solid line, B). For example, when the interval of the BPM grid is 20 nm, the interval of the FDTD grid may be 5 nm. However, the interval of the FDTD grid and the interval of the BPM grid are not limited thereto.

Although it is shown in FIG. 18A that the uppermost surface of the FDTD grid and a BPM grid surface match a surface of the upper metallic wiring line 526, they may not match the surface of the upper metallic wiring line 526. That is, when a plurality of BPM grid surfaces are formed with a uniform interval, a BPM grid surface including a metal for the first time from among the plurality of BPM grid surfaces may be placed inside the metal instead of on a surface of the metal. However, for convenience of analysis, the plurality of BPM grid surfaces may be formed with non-uniform intervals, and accordingly, a BPM grid may be formed so that a BPM grid surface including a metal for the first time matches a surface of the metal.

It is shown in FIG. 18A that the FDTD grid is formed only in the upper metallic wiring line 526 and the FDTD grid is not formed in the lower metallic wiring line 524, because it has not been determined whether a BPM grid surface of the lower metallic wiring line 524 includes a metallic or magnetic material.

If the kth grid surface includes a metallic or magnetic material, and accordingly, if an FDTD grid is formed, an electric field with respect to the FDTD grid is calculated in the FDTD method.

Figure 18B:
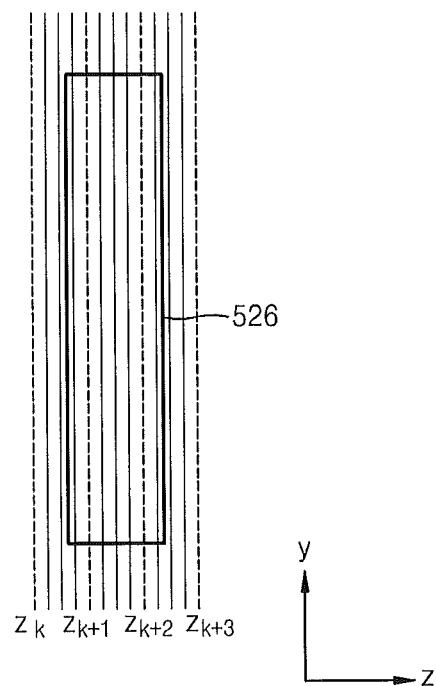

FIG. 18B is a magnified cross-sectional view of a BPM grid and an FDTD grid, wherein the right direction indicates the z-axis direction. As shown in FIG. 18B, a BPM grid surface including a metal for the first time, i.e., a (k+1)th grid surface, does not match a surface of the metal. In addition, a BPM grid surface not including the metal at last, i.e., a (k+3)th grid surface, does not match a surface of the metal, either. In FIG. 18B, dashed lines indicate the BPM grid, and solid lines indicate the FDTD grid.

As shown in FIG. 18B, the FDTD grid may be formed not only inside the metal but also outside the metal. The FDTD grid outside the metal may be necessary to more correctly analyze an electric field reflected or scattered from the surface of the metal.

Figure 19:
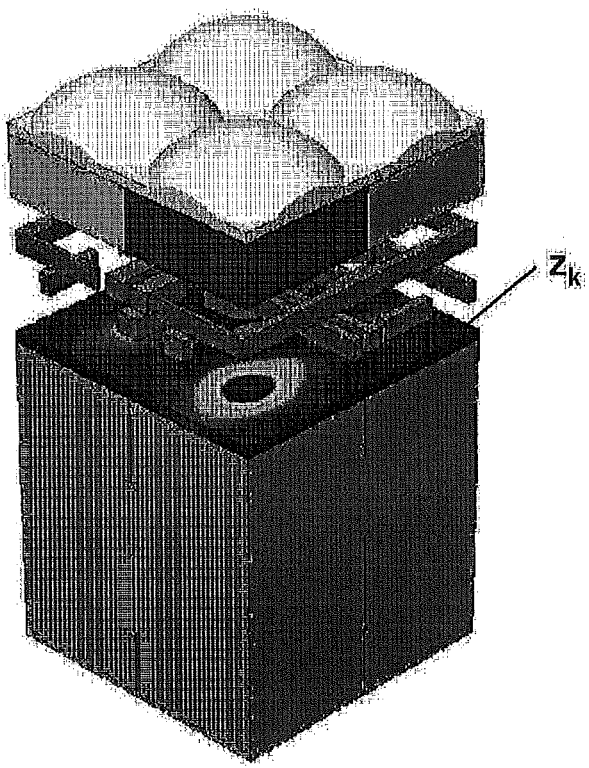

FIG. 19 is a simulation picture showing a distribution of an electric field calculated in the BPM or the FDTD method on a kth grid surface. Data of the electric field calculated in the BPM or the FDTD method on the kth grid surface may be stored as time-dependent data or time-independent data in a storage device or a temporary memory. Thus, FIG. 19 may correspond to the storing of the electric field data with respect to the kth grid surface in operation S260.

In FIG. 19, the kth grid surface may be placed in the lower area (522a of FIG. 10) of the wiring layer (520 of FIG. 10), i.e., on the dielectric layer (510 of FIG. 10), and accordingly, an electric field calculated with respect to the kth grid surface may be time-independent data as electric field data calculated in the BPM.

Figure 20:
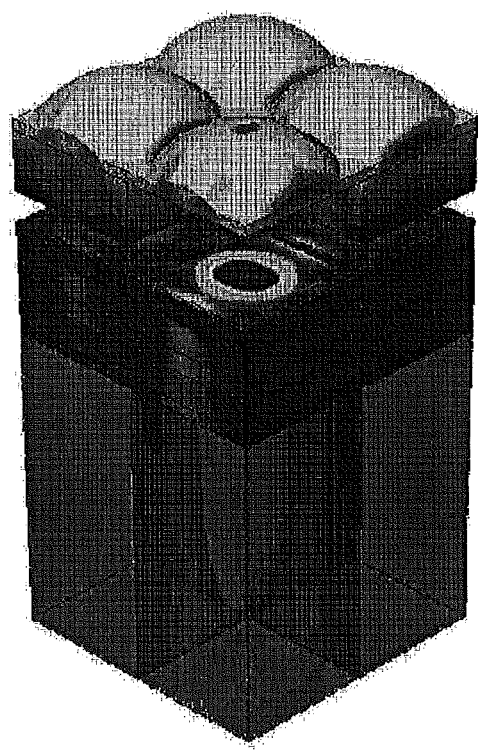

FIG. 20 is a simulation picture showing a distribution of an electric field calculated in the BPM or the FDTD method with respect to the entire CIS analysis region. That is, all of time-independent data calculated in the BPM with respect to an electric field and time-dependent data calculated in the FDTD method with respect to an electric field on each corresponding grid surface are summed and shown as a hybrid electric field distribution or hybrid electric field data with respect to the entire analysis structure. The hybrid electric field distribution or hybrid electric field data indicates that the calculated electric field includes both the time-independent data and the time-dependent data.

Various kinds of optical analysis may be formed with respect to a CIS analysis region based on the calculated hybrid electric field distribution or hybrid electric field data. For example, basically, based on the intensity of an electric field in each part, optical power density and absorption density may be calculated and the performance of hole-electron pair generation may be calculated. The performance of hole-electron pair generation is called quantum efficiency.

As described above, electric field data calculated in the BPM or the FDTD method on each grid surface may be real-time and sequentially stored in the storage device (300 of FIG. 1) to form hybrid electric field data of the entire analysis structure, or may be temporarily stored in the temporary memory (260 of FIG. 3) and transmitted to and stored in the storage device (300 of FIG. 1) as hybrid electric field data of the entire analysis structure when the electric field calculation of the entire analysis structure is completed.

FIGS. 21 to 24 are flowcharts illustrating analyzing an electromagnetic wave, according to various other embodiments described herein.

Figure 21:
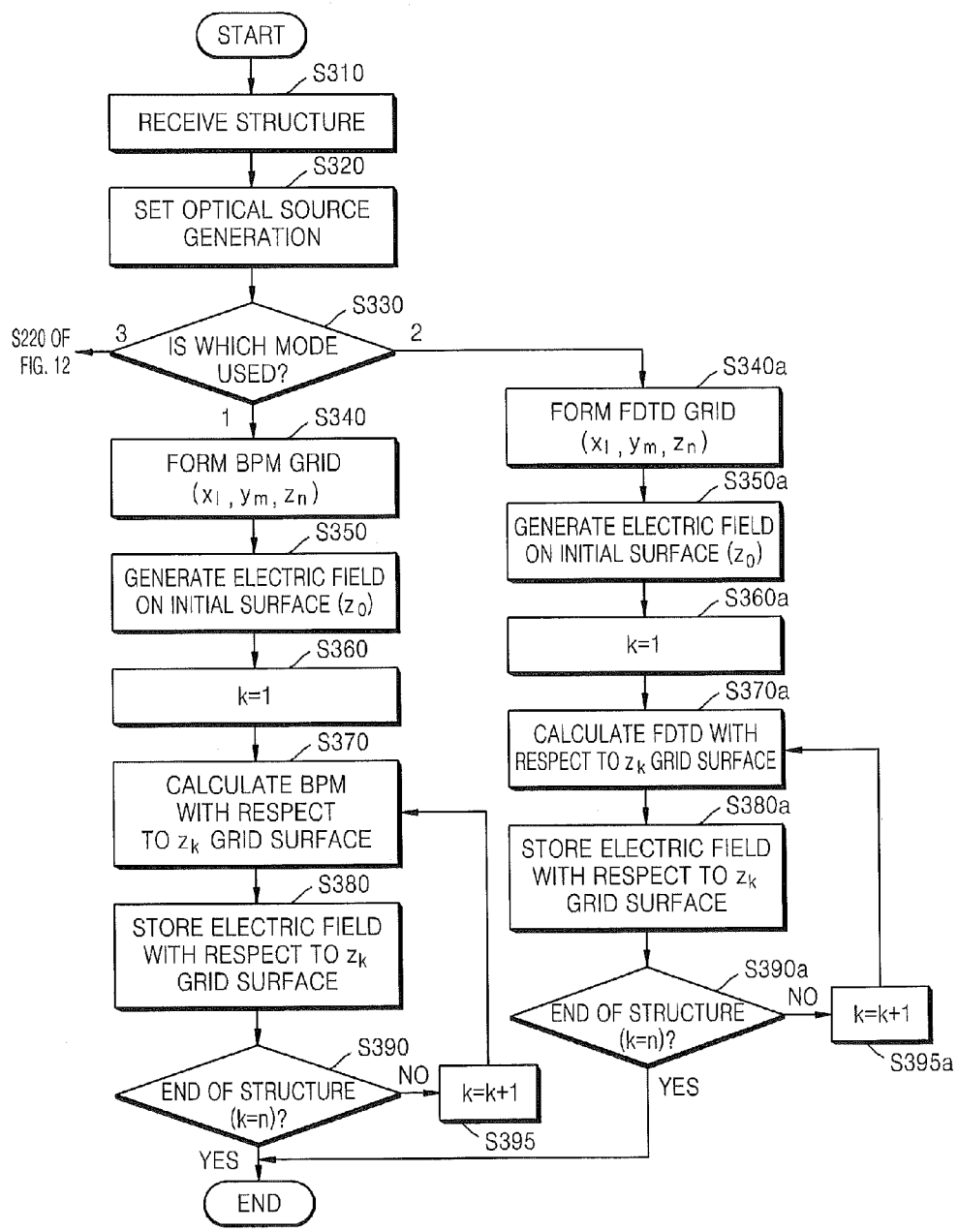
FIGS. 21 to 24 are flowcharts illustrating analyzing an electromagnetic wave, according to various embodiments described herein.

FIG. 21 is a flowchart illustrating analyzing an electromagnetic wave, according to other embodiments described herein. The description made with reference to FIG. 12 will be described in brief or omitted.

Referring to FIG. 21, in operation S310, an analysis structure formed by the structure forming process simulator (100 of FIG. 1) is received from the structure forming process simulator (100 of FIG. 1). The analysis structure may be an analysis structure of the entire optical device or an analysis structure of a portion of the optical device.

In operation S320, the optical source setting unit (220 of FIG. 2) sets optical source generation, based on the received analysis structure. As described above, the optical source generation setting indicates that values of an incident angle, a polarization, a wavelength, and an intensity of light are properly set according to the analysis structure.

After setting the optical source generation, which one of the BPM mode, the FDTD mode, and the hybrid mode is used is selected in operation S330. Here, the BPM mode is a mode in which the BPM is exclusively used, the FDTD mode is a mode in which the FDTD method is exclusively used, and the hybrid mode is a mode in which the BPM and the FDTD methods are both used.

For example, the FDTD mode does not have to be applied to an optical device, such as an optical waveguide in which no metal is included. On the contrary, the FDTD method may be applied to the entire structure in cases where a size of an optical device is very small with a complex metal-including internal structure or cases where a correct electromagnetic wave analysis of the entire analysis region is required.

Accordingly, a time loss according to the general use of the hybrid mode may be reduced by previously determining according to characteristics of an optical device to be analyzed whether to exclusively use the BPM or the FDTD method and selecting a corresponding mode. For example, when the BPM mode or the FDTD mode is selected, determining whether a metallic or magnetic material is included in each BPM grid surface may be omitted.

When the BPM mode is selected (case 1) in mode selection operation S330, a BPM grid is formed in operation S340, an electric field is generated on an initial surface z0 in operation S350, and an electric field is calculated in the BPM with respect to a kth grid surface and stored in operations S360 to S395.

When the FDTD mode is selected (case 2) in mode selection operation S330, an FDTD grid is formed in operation S340a, an electric field is generated on an initial surface z0 in operation S350a, and an electric field is calculated in the FDTD method with respect to the kth grid surface and stored in operations S360a to S395a.

When the hybrid mode in which the BPM and the FDTD methods are both used is selected (case 3) in mode selection operation S330, the analysis process proceeds to BPM grid forming operation S220 of FIG. 12 to calculate and store an electric field by selectively using any one of the BPM and the FDTD method with respect to the kth grid surface, as described with reference to FIG. 12.

Although mode selection operation S330 is performed after optical source generation setting operation S320 in the current embodiment, the inventive concept is not limited thereto, and it does not matter that mode selection operation S330 is performed before optical source generation setting operation S320 or analysis structure receiving operation S310. That is, mode selection operation S330 may be performed before optical source generation setting operation S320 or analysis structure receiving operation S310, and operations corresponding to the cases 1, 2, and 3 after optical source generation setting operation S320 may be performed based on the information obtained by performing mode selection operation S330.

Figure 22:
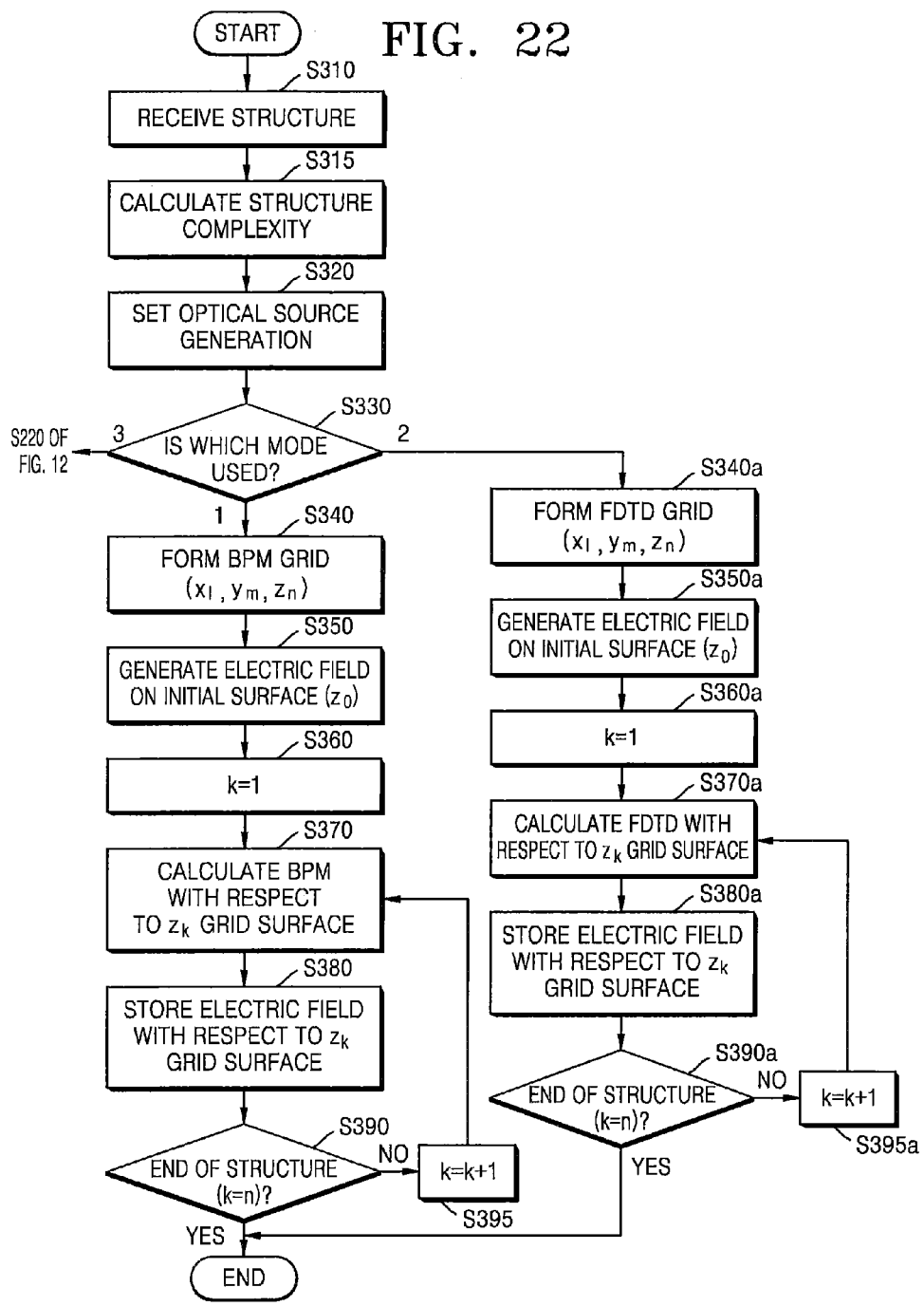

FIG. 22 is a flowchart illustrating analyzing an electromagnetic wave, according to other embodiments described herein. The description made with reference to FIG. 12 will be described in brief or omitted.

Referring to FIG. 22, after performing analysis structure receiving operation S310, a structure complexity of the analysis structure is calculated in operation S315. The calculation complexity may be used in mode selection operation S330. After calculating the structure complexity, optical source generation setting operation S320 is performed and mode selection operation S330 is performed. Description of mode selection operation S330 is the same as described with reference to FIG. 21.

In mode selection operation S330, a mode may be selected according to the complexity of the analysis structure. However, the inventive concept is not limited thereto, and a mode may be selected based on various factors, such as a complexity of an analysis structure, whether a metal is included, an analysis time, and an analysis accuracy.

Figure 23:
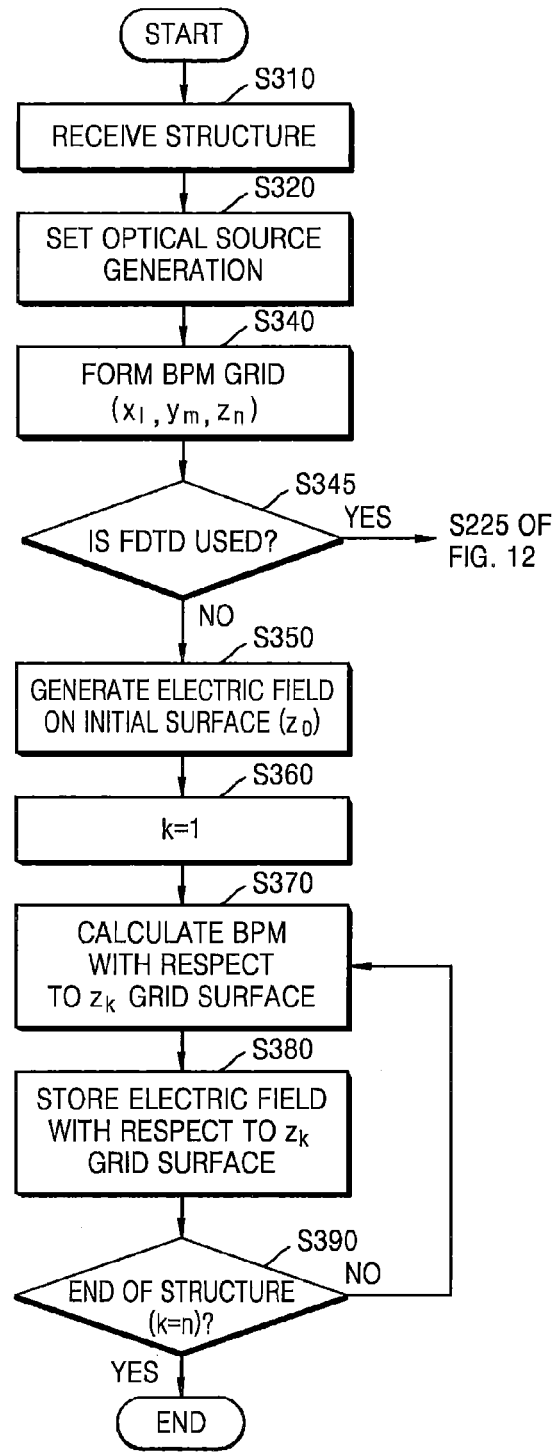

FIG. 23 is a flowchart illustrating analyzing an electromagnetic wave, according to other embodiments described herein. The description made with reference to FIG. 12 will be described in brief or omitted.

Referring to FIG. 23, after performing BPM grid forming operation S340, it is determined in operation S345 whether the FDTD method is used. If the FDTD method is not used, an electric field is generated on an initial surface z0 in operation S350, and if the FDTD method is used, the analysis process proceeds to operation S225 of FIG. 12 to generate an electric field on the initial surface z0.

In the current embodiment, the BPM mode is used as a default, but it is determined whether the FDTD method is used in FDTD use determining operation S345 after forming a BPM grid, and only if the FDTD method is not used, the BPM may be used. Accordingly, because material determining may be omitted, an electromagnetic wave analysis of an analysis structure may be able to be quickly performed. Of course, when the FDTD method is used, the electromagnetic wave analysis of the analysis structure may be performed by selectively using the BPM or the FDTD method as described with reference to FIG. 12.

Figure 24:
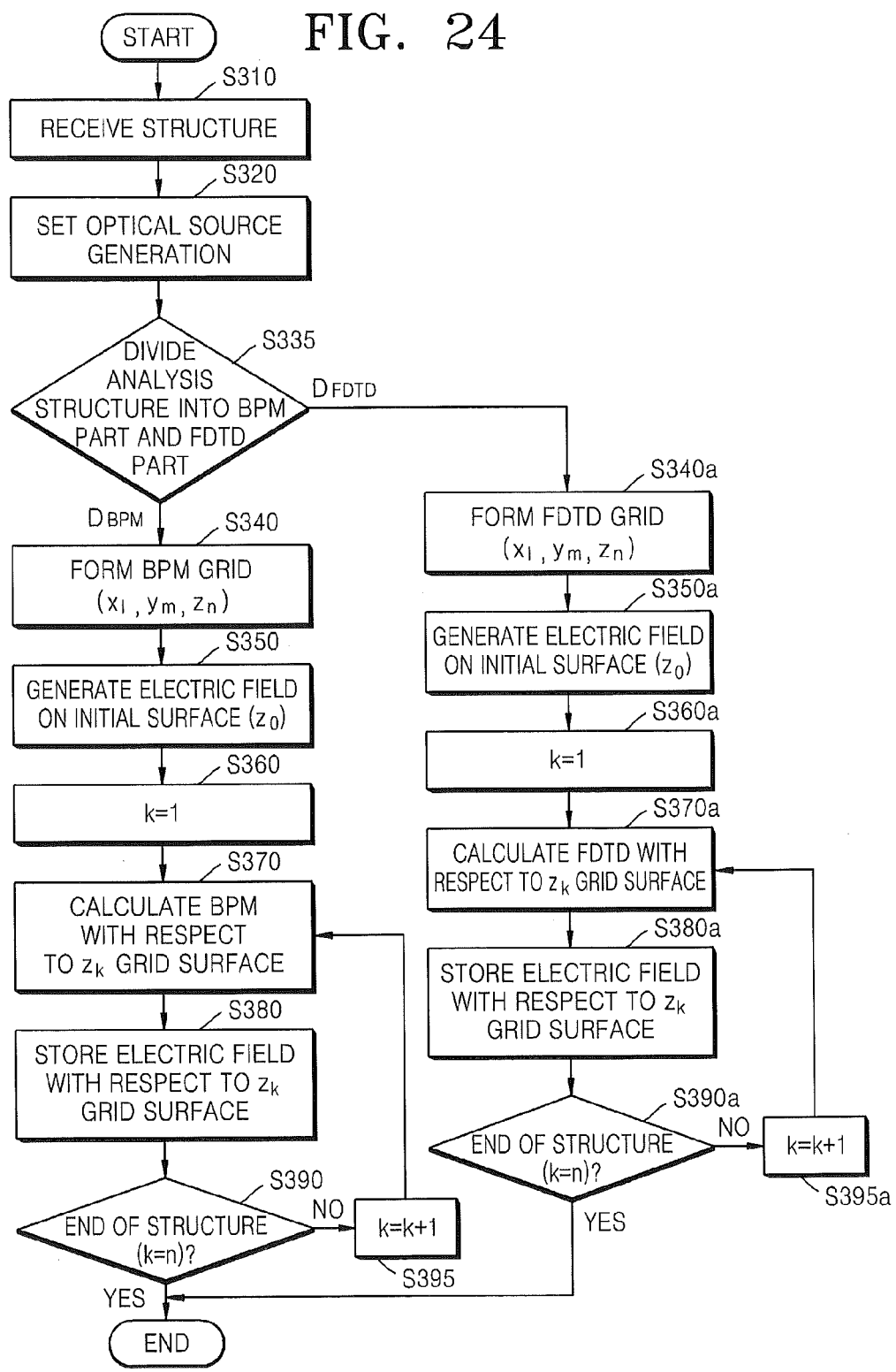

FIG. 24 is a flowchart illustrating analyzing an electromagnetic wave, according to other embodiments described herein. The description made with reference to FIG. 12 will be described in brief or omitted.

Referring to FIG. 24, after performing optical source generation setting operation S320, the analysis structure is divided into a BPM part and an FDTD part in operation S335. That is, the analysis structure is divided into the BPM part to which the BPM is exclusively applied and the FDTD part to which the FDTD method is exclusively applied. This may correspond to that the analysis structure is divided into sectors as described with reference to FIG. 7. That is, the first sector consisting of only a dielectric material may correspond to the BPM part, and the second sector further including a metallic or magnetic material may correspond to the FDTD part.

After dividing the analysis structure, the analysis process proceeds to BPM grid forming operation S340, and thereafter, an electromagnetic wave is analyzed by the BPM with respect to the BPM part based on information DBPM regarding the BPM part in operations S340 to S390. Otherwise, the analysis process proceeds to FDTD grid forming operation S340a, and thereafter, an electromagnetic wave is analyzed by the FDTD method with respect to the FDTD part based on information DFDTD regarding the FDTD part in operations S340a to S390a.

In the current embodiment, whether each BPM grid surface includes a metallic or magnetic material does not have to be determined by previously dividing an analysis structure into a BPM part and an FDTD part and calculating an electric field by the BPM and the FDTD method with respect to the BPM part and the FDTD part, respectively. Accordingly, the electromagnetic wave analyzing method according to the current embodiment may be able to quickly perform an electromagnetic wave analysis of an analysis structure.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An apparatus for analyzing an electromagnetic wave, the apparatus comprising:
   a structure forming process simulator configured to form an analysis structure of a physical object to be analyzed;
   a hybrid optical simulator comprising a processor configured to calculate time-independent data and time-dependent data of an electromagnetic field by receiving the analysis structure from the structure forming process simulator, dividing the analysis structure into parts, determining whether a metallic or magnetic material is included in each of the divided parts, and selectively applying a Beam Propagation Method (BPM) or a Finite Difference Time Domain (FDTD) method to the divided parts; and
   a temporary memory configured to store the time-independent data and the time-dependent data output from the hybrid optical simulator as hybrid electric field data,
   wherein the structure forming process simulator is configured to modify the analysis structure based on the hybrid electric field data stored in a storage device,
   wherein the hybrid optical simulator comprises:
   a receiving unit configured to receive the analysis structure;
   an optical source setting unit configured to set optical source generation based on the analysis structure by setting values of an incident angle, a polarization, a wavelength, and an intensity of light incident on the analysis structure;
   a BPM simulation unit configured to calculate the time-independent data in the BPM using one or more of the values set by the optical source setting unit; and
   an FDTD simulation unit configured to calculate the time-dependent data in the FDTD method using one or more of the values set by the optical source setting unit.

2. The apparatus of claim 1, wherein the hybrid optical simulator further comprises:
   a material decision unit configured to determine whether a metallic or magnetic material is included in each of the divided parts.

3. The apparatus of claim 2, wherein the material decision unit determines by calculating a refractive index whether a metallic or magnetic material is included in each surface of the BPM grid that corresponds to each of the divided parts.

4. The apparatus of claim 1, wherein the BPM simulation unit comprises:
   a BPM grid element configured to form a BPM grid corresponding to the divided parts with respect to the analysis structure; and
   a BPM calculating element configured to calculate an electric field by the BPM with respect to each surface of the BPM grid that is perpendicular to a light-traveling direction, and
   wherein the FDTD simulation unit comprises:
   an FDTD grid element configured to form an FDTD grid for the FDTD method with respect to the analysis structure; and
   an FDTD calculating element configured to calculate an electric field and a magnetic field in the FDTD method with respect to each surface of the FDTD grid that is perpendicular to a light-traveling direction.

5. The apparatus of claim 4, wherein the FDTD grid element forms the FDTD grid for applying the FDTD method if the material decision unit determines that a metallic or magnetic material is included in a surface of the BPM grid, and the FDTD calculating element transmits only the calculated electric field of the calculated electric field and magnetic field as the time-dependent data.

6. The apparatus of claim 1, wherein the hybrid optical simulator further comprises an FDTD use decision unit configured to decide the use of the FDTD method, and
   wherein the hybrid optical simulator uses the BPM as a default mode but selectively uses the BPM or the FDTD method according to the decision of the FDTD use decision unit.

7. The apparatus of claim 1, wherein the hybrid optical simulator is further configured to sequentially calculate the time-independent data in the BPM for each surface of the BPM grid that corresponds to each of the divided parts in the light-traveling direction with respect to the analysis structure,
   to calculate the time-dependent data for each surface of the FDTD grid by forming the FDTD grid for the FDTD method with respect to a surface of the BPM grid in which a metallic or magnetic material is included, and
   to calculate the time-independent data for a next surface of the BPM grid if the calculation for each surface of the FDTD grid is completed.

8. The apparatus of claim 7, wherein the time-independent data calculated with respect to each surface of the BPM grid or the time-dependent data calculated with respect to each surface of the FDTD grid is real-time and sequentially stored in the temporary memory as the hybrid electric field data, or
   is real-time and sequentially stored in the temporary memory as the hybrid electric field data, and if the entire analysis structure is completely analyzed, the hybrid electric field data is transmitted from the temporary memory to the storage device and stored in the storage device.

9. The apparatus of claim 7, wherein the time-independent data is data of an electric field not changed with respect to time on the BPM grid surface, and
   the time-dependent data is data of an electric field changed with respect to time on the FDTD grid surface.

10. The apparatus of claim 1, wherein the structure forming process simulator is configured to form the analysis structure of the entire or a portion of the physical object to be analyzed.

11. The apparatus of claim 1, further comprising a User Interface (UI) configured to input information regarding the physical object to be analyzed,
    wherein the structure forming process simulator is configured to form the analysis structure according to the information regarding the physical object input via the UI, and
    the temporary memory is configured to supply data to the structure forming process simulator and the hybrid optical simulator.

12. The apparatus of claim 1, wherein the physical object to be analyzed is an optical device having a structure in which an electromagnetic wave travels inside the optical device.

13. An apparatus for analyzing an electromagnetic wave, the apparatus comprising:
    a structure forming process simulator configured to form an analysis structure of a physical object to be analyzed;
    a hybrid optical simulator comprising a processor configured to calculate data of an electric field by receiving the analysis structure from the structure forming process simulator and using any one of a Beam Propagation Method (BPM) mode in which the BPM is exclusively used, a Finite Difference Time Domain (FDTD) mode in which an FDTD method is exclusively used, and a hybrid mode in which the BPM and the FDTD methods are both used; and a temporary memory configured to store the data of an electric field output from the hybrid optical simulator, wherein the structure forming process simulator is configured to modify the analysis structure based on the data of the electric field output from the hybrid optical simulator stored in a storage device, wherein the hybrid optical simulator comprises:
a receiving unit configured to receive the analysis structure;
an optical source setting unit configured to set optical source generation based on the analysis structure by setting values of an incident angle, a polarization, a wavelength, and an intensity of light incident on the analysis structure;
a BPM simulation unit configured to calculate the time-independent data in the BPM using one or more of the values set by the optical source setting unit; and
an FDTD simulation unit configured to calculate the time-dependent data in the FDTD method using one or more of the values set by the optical source setting unit.

14. The apparatus of claim 13, wherein the hybrid optical simulator further comprises:
a mode selecting unit configured to select any one of the BPM mode, the FDTD mode, and the hybrid mode;
a material decision unit configured to determine whether a metallic or magnetic material is included in each of divided parts of the analysis structure.

15. The apparatus of claim 14, wherein if the BPM mode is selected by the mode selecting unit, only the BPM simulation unit operates, if the FDTD mode is selected by the mode selecting unit, only the FDTD simulation unit operates, if the hybrid mode is selected by the mode selecting unit, both the BPM simulation unit and the FDTD simulation unit operate, and
if the BPM mode or the FDTD mode is selected, the material decision unit does not operate.

16. The apparatus of claim 14, wherein the hybrid optical simulator further comprises a structure complexity decision unit configured to determine a complexity of the analysis structure, wherein
the mode selecting unit is configured to select any one of the BPM mode, the FDTD mode, and the hybrid mode according to the complexity output from the structure complexity decision unit.

17. An apparatus for analyzing an electromagnetic wave, the apparatus comprising:
a structure forming process simulator configured to form an analysis structure of a physical object to be analyzed;
a hybrid optical simulator comprising a processor configured to calculate time-independent data and time-dependent data of an electric field by receiving the analysis structure from the structure forming process simulator and selectively applying a Beam Propagation Method (BPM) or a Finite Difference Time Domain (FDTD) method to a dielectric material part and a part including a metallic or magnetic material of the analysis structure based on information regarding the dielectric material part and the part including a metallic or magnetic material; and
a temporary memory configured to store the time-independent data and the time-dependent data output from the hybrid optical simulator as hybrid electric field data,
wherein the structure forming process simulator is configured to modify the analysis structure based on the hybrid electric field data from the hybrid optical simulator stored in a storage device, wherein the hybrid optical simulator comprises:
a receiving unit configured to receive the analysis structure;
an optical source setting unit configured to set optical source generation based on the analysis structure by setting values of an incident angle, a polarization, a wavelength, and an intensity of light incident on the analysis structure;
a BPM simulation unit configured to calculate the time-independent data in the BPM using one or more of the values set by the optical source setting unit; and
an FDTD simulation unit configured to calculate the time-dependent data in the FDTD method using one or more of the values set by the optical source setting unit.

18. The apparatus of claim 17, wherein the hybrid optical simulator comprises:
a receiving unit configured to receive the analysis structure;
an optical source setting unit configured to set initial optical source generation, based on the analysis structure;
a sector information unit having the information regarding the dielectric material part and the part including a metallic or magnetic material of the analysis structure;
a BPM simulation unit configured to calculate the time-independent data in the BPM; and
an FDTD simulation unit configured to calculate the time-dependent data in the FDTD method.

19. The apparatus of claim 18, wherein based on the information regarding the sector information unit,
the BPM simulation unit is configured to calculate the time-independent data in the BPM with respect to the dielectric material part, and
the FDTD simulation unit is configured to calculate the time-dependent data in the FDTD method with respect to the part including a metallic or magnetic material.

20. A method of analyzing an electromagnetic wave, the method comprising:
providing an analysis structure of a physical object to be analyzed in a structure forming process simulator;
calculating at least one of time-independent data and time-dependent data of an electric field in a hybrid optical simulator by selectively applying a Beam Propagation Method (BPM) or a Finite Difference Time Domain (FDTD) method to the analysis structure; and
storing the at least one of the time-independent data and the time-dependent data output from the hybrid optical simulator in a temporary memory as hybrid electric field data,
wherein the structure forming process simulator forms the analysis structure of the entire or a portion of the physical object to be analyzed and uses the hybrid electric field data stored in a storage device to modify the analysis structure,
wherein the calculating of the at least one of the time-independent data and the time-dependent data comprises:
receiving the analysis structure;
setting optical source generation based on the analysis structure by setting values of an incident angle, a polarization, a wavelength, and an intensity of light incident on the analysis structure;
calculating the time-independent data in the BPM using one or more of the values set by the optical source setting unit; and
calculating the time-dependent data in the FDTD method using one or more of the values set by the optical source setting unit.

21. The method of claim 20, wherein the calculating of the at least one of the time-independent data and the time-dependent data further comprises:
- determining whether a metallic or magnetic material is included in each of parts divided from the analysis structure, in a traveling direction of light generated by the optical source; and
- selectively calculating the time-independent data or the time-dependent data of each of the divided parts in the BPM or the FDTD method based on the determination result.

22. The method of claim 21, wherein the determining and the selectively calculating comprises:
- forming a BPM grid for the BPM in a BPM simulation unit;
- generating light on an initial surface Z0 that is perpendicular to a light-traveling direction;
- assigning 1 to a variable k (k is an integer) with regard to each surface of the BPM grid;
- first determining whether a metallic or magnetic material is included in a kth surface $Z_k$ of the BPM grid;
- if a metallic or magnetic material is not included in the kth surface $Z_k$ of the BPM grid, calculating the time-independent data in the BPM with respect to the kth surface $Z_k$ of the BPM grid;
- second determining whether the kth surface $Z_k$ is the end of the BPM grid; and
- if the kth surface $Z_k$ is not the end of the BPM grid, increasing k by 1,
- wherein the first determining is performed after increasing k by 1.

23. The method of claim 22, further comprising:
- if a metallic or magnetic material is included in the kth surface $Z_k$ of the BPM grid, forming an FDTD grid for the FDTD method in an FDTD simulation unit; and
- calculating the time-dependent data in the FDTD method with respect to the FDTD grid,
- wherein the second determining is performed after calculating the time-dependent data.

24. The method of claim 23, wherein the FDTD grid is formed with a narrower interval than that of the BPM grid, and
- the calculating of the time-dependent data comprises calculating an electric field and a magnetic field in the FDTD method but storing only the electric field of the electric field and the magnetic field as the time-dependent data.

25. The method of claim 21, wherein the first determining comprises:
- determining by calculating a refractive index whether a metallic or magnetic material is included.

26. The method of claim 20, wherein the calculating of the at least one of the time-independent data and the time-dependent data comprises:
- selecting any one of a BPM mode in which the BPM is exclusively used, an FDTD mode in which the FDTD method is exclusively used, and a hybrid mode in which the BPM and the FDTD methods are both used; and
- calculating hybrid electric field data in at least one of the BPM and the FDTD method according to the selecting result.

27. The method of claim 26, further comprising if the hybrid mode is selected in the selecting, determining whether a metallic or magnetic material is included in each of parts divided from the analysis structure, in a traveling direction of light generated by the optical source, and
- the calculating of the hybrid electric field data comprises calculating the hybrid electric field data by selectively applying the BPM or the FDTD method according to whether a metallic or magnetic material is included.

28. The method of claim 26, further comprising, before the selecting, determining a complexity of the analysis structure,
- wherein the selecting comprises selecting any one of the BPM mode, the FDTD mode, and the hybrid mode according to the complexity.

29. The method of claim 20, wherein the calculating of the at least one of the time-independent data and the time-dependent data comprises:
- forming a BPM grid for the BPM in a BPM simulation unit;
- determining whether the FDTD method is used; and
- calculating the hybrid electric field data by using the BPM exclusively or using the BPM and the FDTD method together according to the determination result.

30. The method of claim 20, wherein the calculating of the at least one of the time-independent data and the time-dependent data comprises:
- receiving information regarding a dielectric material part and a part including a metallic or magnetic material of the analysis structure; and
- calculating the hybrid electric field data in the BPM for the dielectric material part and in the FDTD method for the part including a metallic or magnetic material based on the information.

31. The method of claim 20, wherein the time-independent data or the time-dependent data calculated with respect to each part divided from the analysis structure along the light-traveling direction is real-time and sequentially stored in the temporary memory as the hybrid electric field data, or
- the hybrid electric field data is real-time and sequentially stored in the temporary memory, and if the entire analysis structure is completely analyzed, the hybrid electric field data is transmitted from the temporary memory to the storage device.

* * * * *